(12) United States Patent
Kim et al.

(10) Patent No.: US 9,716,128 B2
(45) Date of Patent: Jul. 25, 2017

(54) METHODS OF MANUFACTURING SEMICONDUCTOR DEVICES

(71) Applicant: Samsung Electronics Co., Ltd., Suwon-si, Gyeonggi-do (KR)

(72) Inventors: Young-Kuk Kim, Seoul (KR); Young-Wook Park, Osan-si (KR); Jeon-Il Lee, Suwon-si (KR); Hyun-Jung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 122 days.

(21) Appl. No.: 14/659,806

(22) Filed: Mar. 17, 2015

(65) Prior Publication Data

US 2016/0035788 A1    Feb. 4, 2016

(30) Foreign Application Priority Data

Jul. 31, 2014 (KR) .................. 10-2014-0098485

(51) Int. Cl.
*H01L 27/22* (2006.01)
*H01L 29/66* (2006.01)
(Continued)

(52) U.S. Cl.
CPC ...... *H01L 27/228* (2013.01); *H01L 21/28518* (2013.01); *H01L 21/76897* (2013.01); *H01L 27/10814* (2013.01); *H01L 27/10855* (2013.01); *H01L 27/10876* (2013.01); *H01L 27/10885* (2013.01); *H01L 29/4236* (2013.01);
(Continued)

(58) Field of Classification Search
CPC ............ H01L 27/228; H01L 21/28518; H01L 21/76897; H01L 27/10814
See application file for complete search history.

(56) References Cited

U.S. PATENT DOCUMENTS 7,829,461 B2    11/2010    Kawamura et al.
8,304,340 B2    11/2012    Izawa
(Continued)

FOREIGN PATENT DOCUMENTS

JP    2002-319636 A    10/2002
JP    2012-142548 A    7/2012
(Continued)

*Primary Examiner* — Errol Fernandes
(74) *Attorney, Agent, or Firm* — Harness, Dickey & Pierce, P.L.C.

(57) ABSTRACT

Active patterns spaced apart from each other by an isolation layer are formed in a substrate. Gate structures extending in the isolation layer through the active patterns are formed. Each active pattern is divided into a central portion and a peripheral portion facing the central portion by the gate structures. A protrusion of at least one of active pattern is formed. The protrusion is exposed from a top surface of the isolation layer, and transformed into silicide such that a first silicide ohmic pad is formed at the central portion of the active pattern and a second silicide ohmic pad is formed at the peripheral portion of the active pattern. A conductive line structure electrically connected to the first silicide ohmic pad is formed. A conductive contact electrically connected to the second silicide ohmic pad is formed. A data storage unit electrically connected to the conductive contact is formed.

20 Claims, 24 Drawing Sheets

(51) Int. Cl.
 *H01L 27/108* (2006.01)
 *H01L 29/423* (2006.01)
 *H01L 43/08* (2006.01)
 *H01L 43/12* (2006.01)
 *H01L 29/45* (2006.01)
 *H01L 21/768* (2006.01)
 *H01L 21/285* (2006.01)

(52) U.S. Cl.
 CPC .......... *H01L 29/456* (2013.01); *H01L 29/665* (2013.01); *H01L 29/66621* (2013.01); *H01L 43/08* (2013.01); *H01L 43/12* (2013.01)

(56) References Cited

U.S. PATENT DOCUMENTS

| | | | |
|---|---|---|---|
| 8,367,548 B2 | 2/2013 | Machkaoutsan et al. | |
| 8,390,046 B2 | 3/2013 | Kawahara et al. | |
| 8,643,126 B2 | 2/2014 | Hampp | |
| 2002/0113237 A1 | 8/2002 | Kitamura | |
| 2005/0145912 A1* | 7/2005 | Kidoh | H01L 27/10867 257/301 |
| 2005/0275102 A1 | 12/2005 | Ahn | |
| 2007/0278610 A1 | 12/2007 | Kim | |
| 2008/0087950 A1* | 4/2008 | Ueda | H01L 21/31116 257/330 |
| 2009/0026515 A1 | 1/2009 | Shin et al. | |
| 2010/0270602 A1* | 10/2010 | Choi | H01L 27/10876 257/296 |
| 2011/0298046 A1 | 12/2011 | Hong | |
| 2012/0171846 A1 | 7/2012 | Hwang | |
| 2012/0211813 A1* | 8/2012 | Taketani | H01L 27/10814 257/296 |
| 2013/0140516 A1 | 6/2013 | Lee et al. | |
| 2013/0264655 A1* | 10/2013 | Kishida | H01L 23/535 257/392 |
| 2013/0328160 A1* | 12/2013 | Ota | H01L 27/04 257/506 |

FOREIGN PATENT DOCUMENTS

| | | |
|---|---|---|
| KR | 0603588 B1 | 7/2006 |
| KR | 0764409 B1 | 9/2007 |
| KR | 2008-0002480 A | 1/2008 |
| KR | 2009-0010486 A | 1/2009 |
| KR | 1116360 B1 | 2/2012 |
| KR | 2013-0063070 A | 6/2013 |

* cited by examiner

METHODS OF MANUFACTURING SEMICONDUCTOR DEVICES

CROSS-REFERENCE TO RELATED APPLICATION

This application claims priority under 35 USC §119 to Korean Patent Application No. 10-2014-0098485, filed on Jul. 31, 2014 in the Korean Intellectual Property Office (KIPO), the contents of which are incorporated by reference herein in their entirety.

BACKGROUND

Some example embodiments of the inventive concepts relate to methods of manufacturing semiconductor devices. More particularly, some example embodiments of the inventive concepts relate to methods of manufacturing semiconductor devices including a buried gate.

As a degree of integration and a capacity of a semiconductor device such as a dynamic random access memory (DRAM) device becomes increased, a distance between conductive structures (e.g., wirings or contacts) may become narrower, and/or aspect ratios of the conductive structures may be increased. Accordingly, a physical defect of the conductive structures may be caused, and a contact resistance may be increased due to a reduction of a contact area.

Therefore, methods of forming the conductive structures without a deterioration of electrical and mechanical properties have been researched for realizing a highly integrated semiconductor device.

SUMMARY

Some example embodiments of the inventive concepts provide a semiconductor device having improved electrical and mechanical properties.

Some example embodiments provide a method of manufacturing a semiconductor device having improved electrical and mechanical properties.

According to some example embodiments of the inventive concepts, a method of manufacturing a semiconductor device may be provided. In one embodiment of the method, a plurality of active patterns may be formed in a substrate. The active patterns may be spaced apart from each other by an isolation layer. Gate structures, each of which extends in the isolation layer through the active patterns, may be formed. Each of the active patterns may be divided by the gate structures into a central portion and a peripheral portion facing the central portion. A protrusion from each of the active patterns may be formed. The protrusion may be exposed from a top surface of the isolation layer. The protrusions may be transformed into silicide such that a first silicide ohmic pad is formed at the central portion of each the active patterns, and a second silicide ohmic pad is formed at the peripheral portion of each of the active patterns. A conductive line structure electrically connected to the first silicide ohmic pad may be formed. A conductive contact electrically connected to the second silicide ohmic pad may be formed. A data storage unit electrically connected to the conductive contact may be formed.

In some example embodiments, the first and second silicide ohmic pads may include a metal silicide or a carbon-doped metal silicide.

In some example embodiments, a first source/drain region and a second source/drain region may be further formed in each of the active patterns. The first source/drain region may be formed in the central portion of each of the active patterns, and the second source/drain region may be formed in the peripheral portion of each of the active patterns. The first silicide ohmic pad may be in contact with the first source/drain region, and the second silicide ohmic pad may be in contact with the second source/drain region.

In some example embodiments, in the transforming the isolation layer may be partially recessed to form the protrusion of each of the active patterns. A metal layer may be formed each of the protrusions. Each of the protrusions and the metal layer may be reacted such that each of the protrusions may be transformed into a metal silicide.

In some example embodiments, in forming gate structures, trenches spaced apart from each other may be formed. The trenches may extend through the active patterns and the isolation layer. A gate insulation layer may be formed on an innerwall of each of the trenches. A gate electrode and gate mask pattern may be formed on the gate insulation layer to fill each of the trenches. Two of the gate structures may extend through each of the active patterns.

In some example embodiments, the gate line structure and the conductive line structure may extend in a first direction and a second direction, respectively, which cross each other. The active pattern may extend in a diagonal direction with respect to the first direction or the second direction by a angle.

In some example embodiments, the first silicide ohmic pad and the second silicide ohmic pad may extend to a top surface of the isolation layer to have a width greater than a width of the active pattern.

In some example embodiments, a bottom of each of the first and second silicide ohmic pads may be in contact with a top surface of the isolation layer.

In some example embodiments, a capping layer covering the first and second silicide ohmic pads may be formed. The capping layer may be partially removed to form a groove through which at least one of the first silicide ohmic pads is exposed. The conductive line structure may be formed in the groove.

In some example embodiments, an insulating interlayer covering the conductive line structure may be formed on the substrate. The insulating interlayer may be partially removed to form a contact hole through which at least one of the second silicide ohmic pad is exposed. The conductive contact electrically connected to the second silicide ohmic pad may be formed in the contact hole.

In some example embodiments, the data storage unit may include a capacitor or a magnetic tunnel junction (MTJ) structure.

According to some example embodiments of the inventive concepts, a method of manufacturing a semiconductor device may be provided. In one embodiment of the method, a plurality of active patterns is formed in a substrate. The active patterns are spaced apart from each other by an isolation layer. Gate structures, each of which extends in the isolation layer through the active patterns are formed. The isolation layer is recessed such that upper portions of the active patterns are exposed. A metal layer covering the active patterns is formed on the isolation layer. The metal layer and the upper portions of the active patterns are reacted such that the upper portions of the active patterns are transformed into silicide ohmic pads.

In some example embodiments, in forming gate structures, trenches may be formed in the active patterns and the isolation layer. A gate insulation layer may be formed on an innerwall of each of the trenches. A gate electrode and gate mask pattern may be formed on the gate insulation layer to fill each of the trenches.

In some example embodiments, carbon may be doped in the upper portions of the active patterns.

In some example embodiments, the silicide ohmic pads may include a carbon-doped metal silicide.

In some example embodiments, before forming the metal layer, the upper portions of the active patterns may be selectively and epitaxially grown such that a dimension of the upper portions may be expanded.

In some example embodiments, the upper portions of the active patterns may extend to a top surface of the isolation layer.

According to some example embodiments of the inventive concepts, a method of manufacturing a semiconductor device may be provided. In one embodiment of the method, An isolation layer is formed in the substrate. The isolation layer defines a plurality of active patterns spaced apart from each other. Gate structures, each of which extends through the active patterns and the isolation layer in a diagonal direction with respect to an extension direction of each of the active patterns are formed. The isolation layer may be partially removed such that recess regions are defined by a top surface of the isolation layer and upper sidewalls of the active patterns. A metal layer filling the recess regions and covering the active patterns is formed. Portions of the active patterns in contact with the metal layer may be transformed into metal silicide ohmic pads.

In some example embodiments, before forming the metal layer, impurity regions in upper portions of the active patterns which define the recess regions may be formed.

In some example embodiments, in the transforming, the metal layer may be thermally treated to cause a silicidation of a portion of the metal layer which is in contact with the active patterns. A portion of the metal layer remaining in the recess region and on the active patterns may be removed.

According to some example embodiments of the inventive concepts, a semiconductor device may be provided. The semiconductor device includes a substrate, an isolation layer, active patterns, gate structures and silicide ohmic pads. The isolation layer is formed in the substrate. The active patterns are limited by the isolation layer to be spaced apart from each other. The gate structures extend through the active patterns in the isolation layer. The silicide ohmic pads protrude from a top surface of the isolation layer, and may be divided by the gate structures into a first silicide ohmic pad and a second silicide ohmic pad.

In some example embodiments, the silicide ohmic pad may include a metal silicide or a carbon-doped metal silicide.

In some example embodiments, the semiconductor device may further include a conductive line structure and a data storage unit. The conductive line structure may be in contact with the first silicide ohmic pad, and may extend to cross the gate structures. The data storage unit may be electrically connected to the second silicide ohmic pad.

BRIEF DESCRIPTION OF THE DRAWINGS

Example embodiments of the inventive concepts will be more clearly understood from the following detailed description taken in conjunction with the accompanying drawings.

FIGS. 1 and 2 are a top plan view and a cross-sectional view, respectively, illustrating a semiconductor device in accordance with example embodiments of the inventive concepts;

FIGS. 3 to 8 are cross-sectional views illustrating a method of manufacturing a semiconductor device in accordance with example embodiments of the inventive concepts;

FIGS. 9 and 10 are a top plan view and a cross-sectional view, respectively, illustrating a semiconductor device in accordance with example embodiments of the inventive concepts;

FIG. 11 is a cross-sectional view illustrating a data storage unit of a semiconductor device in accordance with some example embodiments of the inventive concepts;

FIGS. 12 to 19 are cross-sectional views illustrating a method of manufacturing a semiconductor device in accordance with example embodiments of the inventive concepts;

FIGS. 20 and 21 are a top plan view and a cross-sectional view, respectively, illustrating a semiconductor device in accordance with example embodiments of the inventive concepts; and FIGS. 22 to 25 are cross-sectional views illustrating a method of manufacturing a semiconductor device in accordance with example embodiments of the inventive concepts.

DESCRIPTION OF EMBODIMENTS

Figure 1:
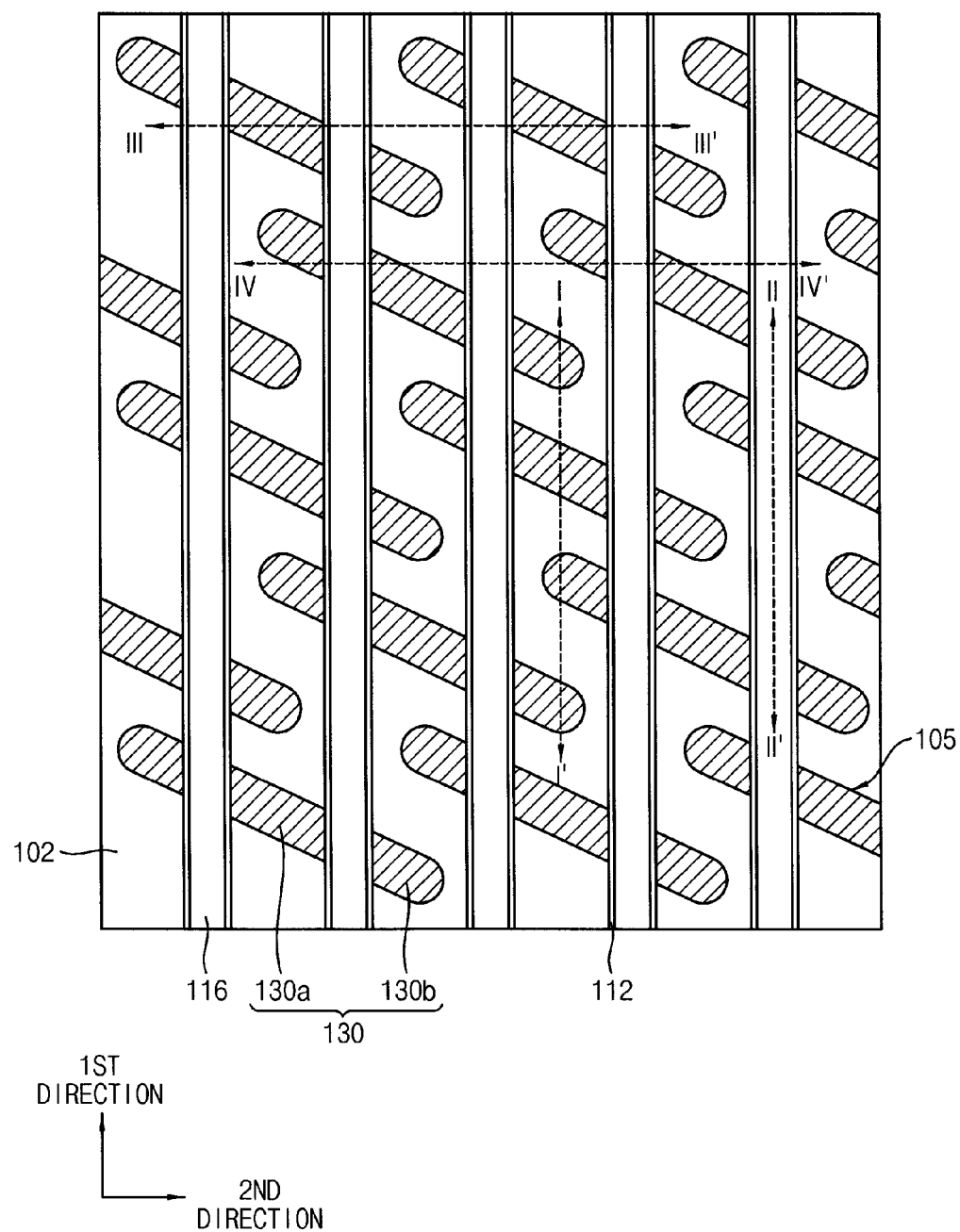
FIGS. 1 to 25 represent non-limiting, example embodiments as described herein.

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
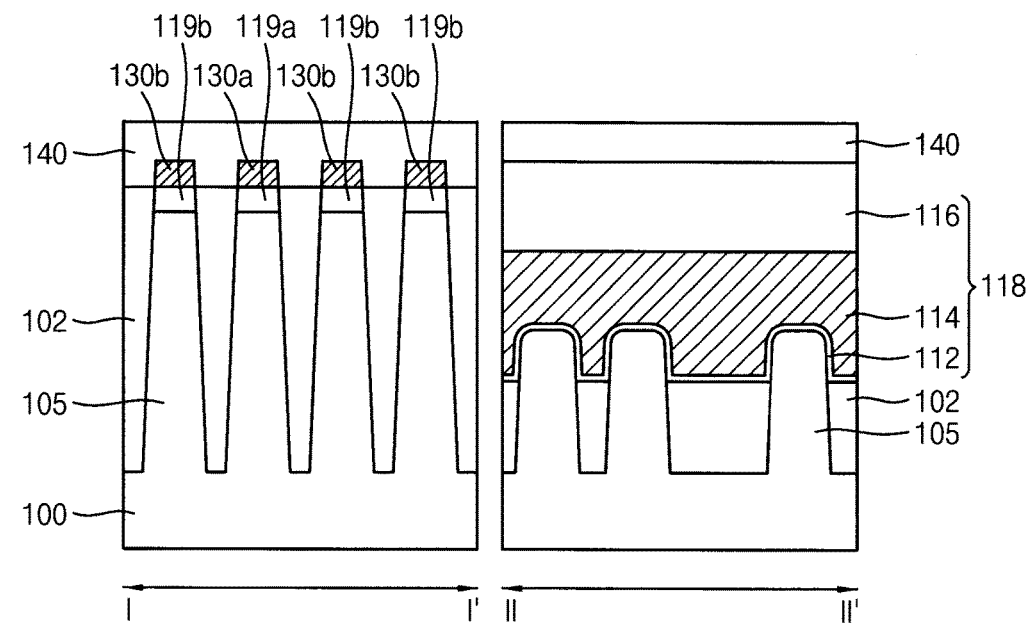
Figure 2:
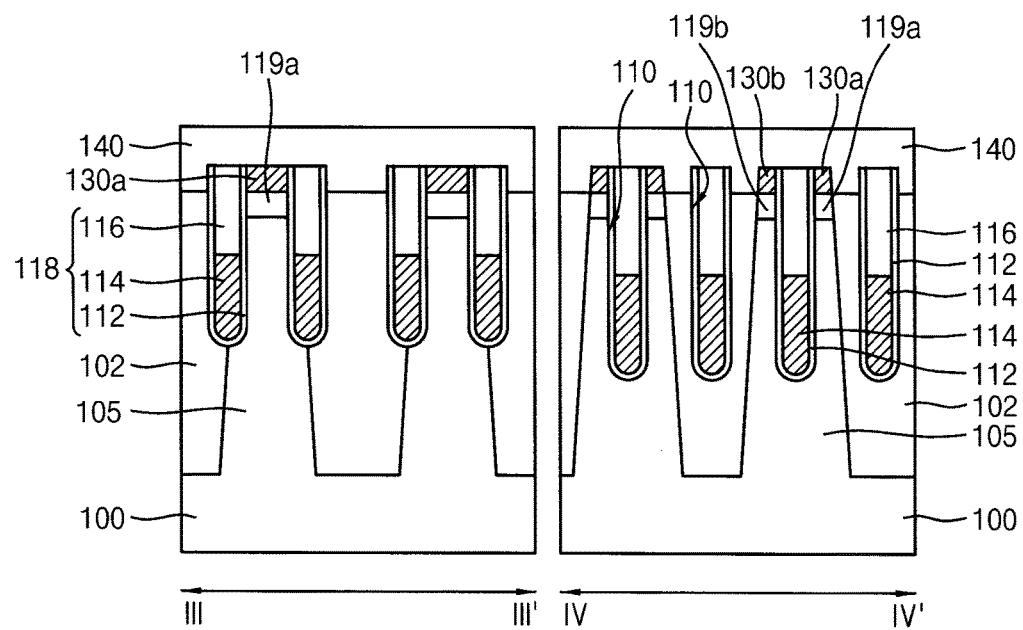

FIGS. 1 and 2 are a top plan view and a cross-sectional view, respectively, illustrating a semiconductor device in accordance with example embodiments of the inventive concepts. For example, FIGS. 1 and 2 illustrate a semiconductor device having a buried cell array transistor (BCAT) structure including a buried gate.

FIG. 2 includes sub-cross sectional views taken along lines I-I', II-II', III-III' and IV-IV' indicated in FIG. 1.

Two directions perpendicular to each other are referred to as a first direction and a second direction. The first and second directions are parallel to a top surface of a substrate. Additionally, a direction indicated by an arrow and a reverse direction thereof are considered to be the same direction. The above mentioned definitions of the directions are the same throughout all the figures.

Referring to FIGS. 1 and 2, the semiconductor device may include a substrate 100, an active pattern 105, and a gate structure 118 that may extend through an upper portion of the active pattern 105 and an isolation layer 102.

The substrate 100 may include silicon, germanium, silicon-germanium or a group III-V compound such as GaP, GaAs, or GaSb. In some embodiments, the substrate 100 may be a silicon-on-insulator (SOI) substrate or a germanium-on-insulator (GOI) substrate.

The active pattern 105 may have substantially an island shape defined by the isolation layer 102.

In example embodiments, the active pattern 105 may extend in a diagonal direction to the first direction or the second direction by a predetermined angle. A plurality of the active patterns 105 may be arranged in the first and second directions. A density of the active patterns 105 in a unit area of the substrate 100 may be increased while maintaining a predetermined distance between the neighboring active patterns 105 due to this arrangement of the active patterns 105.

The isolation layer 102 may include an insulation material such as silicon oxide.

The gate structure 118 may be formed through upper portions of the active patterns 105 and the isolation layer 102, and may extend in the first direction. A plurality of the gate structures 118 may be arranged along the second direction.

The gate structure 118 may be buried or embedded in the active pattern 105. For example, the gate structure 118 may fill a gate trench 110 formed in the active pattern 105.

The gate structure 118 may include a gate insulation layer 112, a gate electrode 114 and a gate mask pattern 116 sequentially stacked from a bottom of the gate trench 110. For example, the gate insulation layer 112 may be formed on a surface of the active pattern 105 exposed by the gate trench 110, and the gate electrode 114 may be formed on the gate insulation layer 112 to fill a lower portion of the gate trench 110. The gate mask pattern 116 may be disposed on the gate insulation layer 112 and the gate electrode 114 to cap an upper portion of the gate trench 110.

The gate insulation layer 112 may include, e.g., silicon oxide and/or a metal oxide. The gate electrode 114 may include, e.g., a metal nitride such as titanium nitride, tantalum nitride or tungsten nitride, and/or a metal such as tantalum, aluminum, titanium or tungsten. The gate mask pattern 116 may include, e.g., silicon nitride.

In example embodiments, two gate structures 118 may be formed per each active pattern 105. Accordingly, an upper portion of the active pattern 105 may be divided into a central portion and two peripheral portions (or both end portions) by the two gate structures 118.

A silicide ohmic pad 130 may be formed on the active pattern 105. A top surface of the silicide ohmic pad 130 may be at a level higher than a top surface of the isolation layer 102. In example embodiments, the silicide ohmic pad 130 may include a metal silicide having a reduced resistance. For example, the silicide ohmic pad 130 may include, e.g., tungsten silicide (WSi), nickel silicide (NiSi), cobalt silicide (CoSi), titanium silicide (TiSi), platinum silicide (PtSi) or molybdenum silicide (MoSi). In some embodiments, the silicide ohmic pad 130 may include a metal silicide doped with carbon.

The silicide ohmic pad 130 may include a first silicide ohmic pad 130*a* and a second silicide ohmic pad 130*b*. The first silicide ohmic pad 130*a* may be formed at the central portion of the active pattern 105, and the second silicide ohmic pad 130*b* may be formed at the peripheral portion (or the both end portions) of the active pattern 105. In some embodiments, the silicide ohmic pad 130 may extend from a top surface of the active pattern 130 to the top surface of the isolation layer 102.

A portion of the gate structure 118 may be located between the first silicide ohmic pad 130*a* and a second silicide ohmic pad 130*b*. For example, the first and second silicide ohmic pads 130*a* and 130*b* may be in contact with a portion of a sidewall of the gate mask pattern 116.

Source/drain regions 119*a* and 119*b* may be formed in the active pattern 105 adjacent to the silicide ohmic pad 130. In example embodiments, a first source/drain region 119*a* and a second source/drain region 119*b* may be formed in the active pattern 105 under the first silicide ohmic pad 130*a* and the second silicide ohmic pad 130*b*, respectively. For example, the source/drain regions 119*a* and 119*b* may include n-type impurities or p-type impurities.

A capping layer 140 may be formed on the isolation layer 102. The capping layer 140 may cover the silicide ohmic pads 130 and the gate structures 118. The capping layer 140 may include an insulation material, e.g., silicon nitride or silicon oxide.

FIGS. 3 to 8 are cross-sectional views illustrating a method of manufacturing a semiconductor device in accordance with example embodiments of the inventive concepts. Each of FIGS. 3 to 8 includes sub-cross sectional views taken along lines I-I', II-II', III-III' and IV-IV' indicated in FIG. 1. For example, FIGS. 3 to 8 illustrate a method of manufacturing the semiconductor device of FIGS. 1 and 2.

Figure 3:
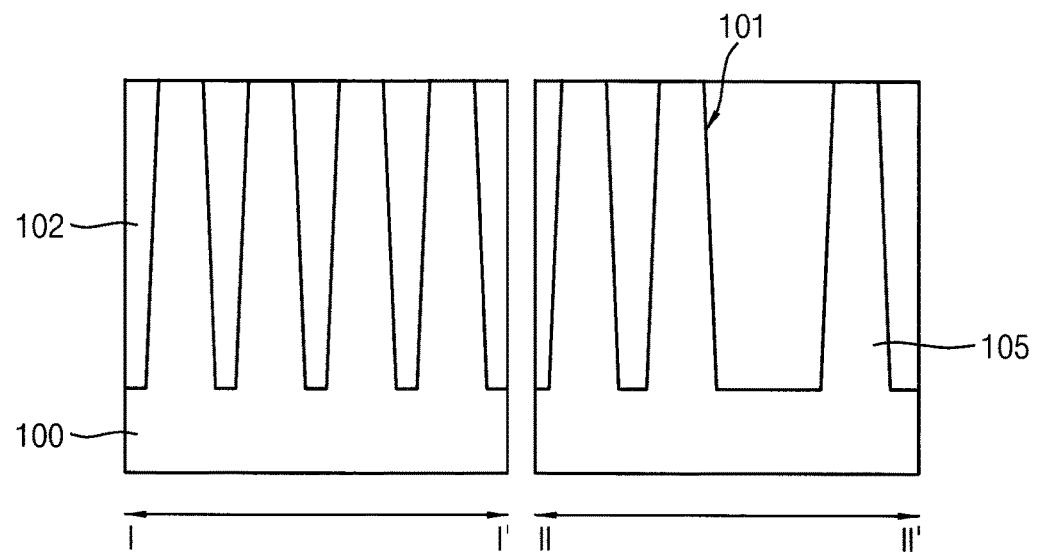
Figure 3:
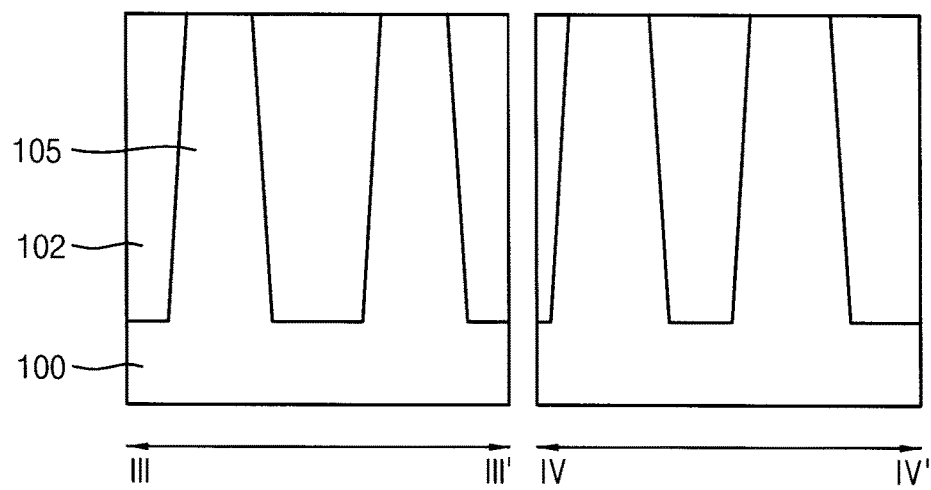

Referring to FIG. 3, an isolation layer 102 and an active pattern 105 may be formed in a substrate 100.

The substrate 100 may include silicon, germanium, silicon-germanium or a group III-V compound such as GaP, GaAs, or GaSb. In some embodiments, the substrate 100 may be an SOI substrate or a GOI substrate.

In example embodiments, the isolation layer 102 and the active pattern 105 may be formed by a shallow trench isolation (STI) process. For example, a hard mask may be formed on a top surface of the substrate 100. An upper portion of the substrate 100 may be partially removed by an anisotropic etching process using the hard mask as an etching mask, such that an isolation trench 101 may be formed.

An insulation layer filling the isolation trench 101 may be formed on the substrate 100 and the hard mask. The insulation layer and the hard mask may be planarized by, e.g., a chemical mechanical polish (CMP) process until a top surface of the substrate 100 is exposed. As a result, the isolation layer 102 may be formed. The isolation layer 102 may include, e.g., silicon oxide.

A plurality of the active patterns 105 may be formed to be spaced apart from each other by the isolation layer 102. As illustrated in FIG. 1, each active pattern 105 may extend in a diagonal direction to the first direction or the second direction by a predetermined angle. The plurality of the active patterns 105 may be arranged in the first and second directions.

Figure 4:
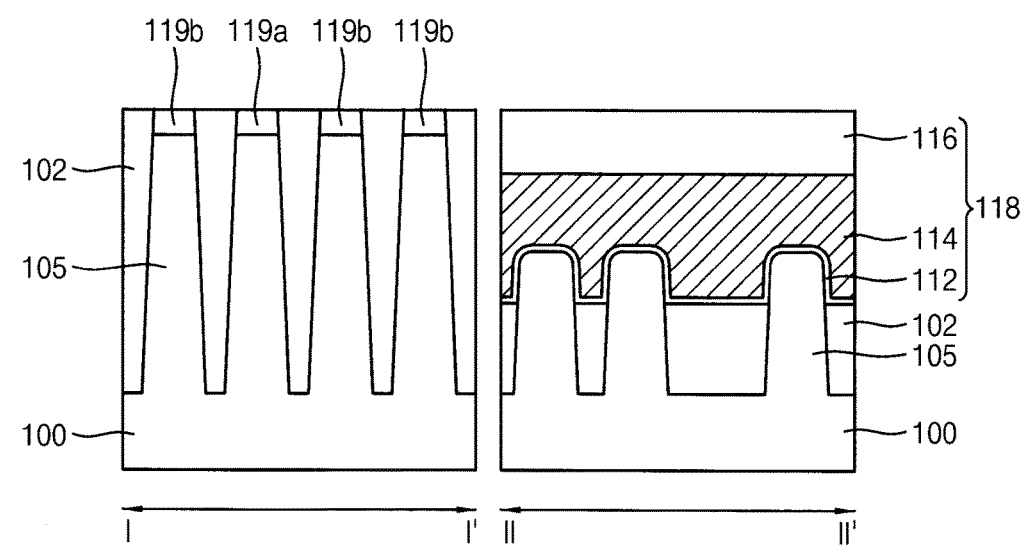
Figure 4:
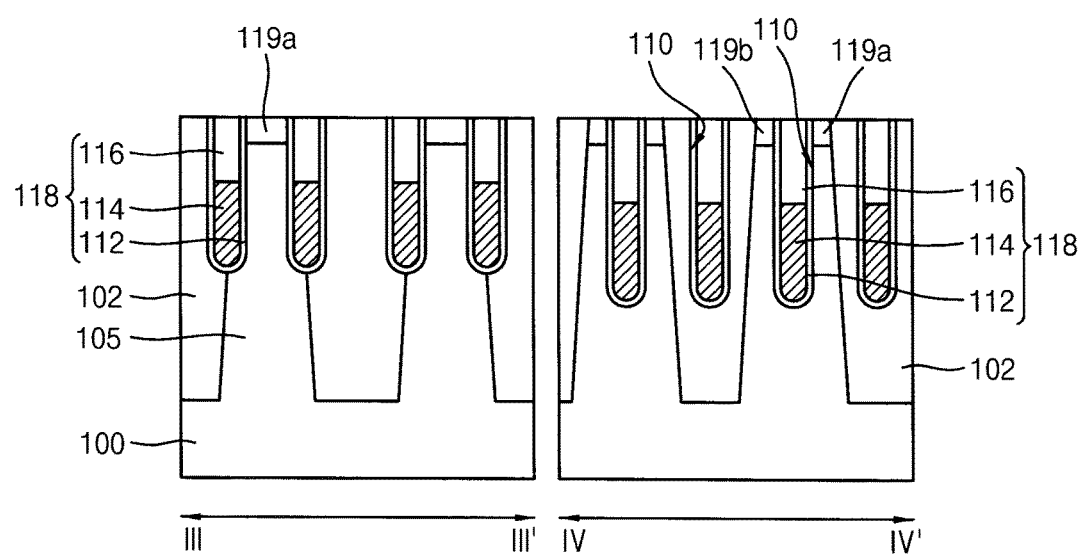

Referring to FIG. 4, a gate structure 118 being buried and extending in the active patterns 105 may be formed.

In example embodiments, upper portions of the isolation layer 102 and the active patterns 105 may be etched to form a gate trench 110. For example, the gate trench 110 may be formed to pass through the upper portions of the isolation layer 102 and the active patterns 105, and may extend in the first direction. A plurality of the gate trenches 110 may be formed to be arranged along the second direction.

In some embodiments, two gate trenches 110 may be formed per each active pattern 105.

A gate insulation layer 112 may be formed on an innerwall of the gate trench 110. In some embodiments, the gate insulation layer 112 may be formed by depositing silicon oxide and/or a metal oxide on the surface of the active pattern 105 by, e.g., a chemical vapor deposition (CVD) process. In other embodiments, the gate insulation layer 112 may include silicon oxide formed by performing a thermal oxidation process on a surface of the active pattern 105 exposed by the gate trench 110.

A gate conductive layer sufficiently filling the gate trench 110 may be formed on the gate insulation layer 112. The gate conductive layer may be planarized by a CMP process until the top surface of the active pattern 105 is exposed, and an upper portion of the gate conductive layer formed in the gate trench 110 may be partially removed by an etch-back process. Accordingly, a gate electrode 114 filling a lower portion of the gate trench 110 may be formed on the gate insulation layer 112.

The gate conductive layer may be formed of a metal nitride such as titanium nitride, tantalum nitride or tungsten nitride, and/or a metal such as tantalum, aluminum or tungsten. The gate conductive layer may be formed by an atomic layer deposition (ALD) process, a sputtering process, a physical vapor deposition (PVD) process or a CVD process.

A mask layer filling a remaining portion of the gate trench 110 may be formed on the gate insulation layer 112 and the gate electrode 114, and an upper portion of the mask layer may be planarized to form a gate mask pattern 116. The mask layer may be formed of silicon nitride by, e.g., a CVD process.

As a result, the gate structure 118 including the gate insulation layer 112, the gate electrode 114 and the gate mask pattern 116 that are sequentially stacked in the gate trench 110 may be formed.

According to an arrangement of the gate trenches 110, a plurality of the gate structures 118 may be formed to be arranged along the second direction and each gate structure 118 may extend in the first direction. The gate structure 118 may be buried or embedded in an upper portion of the active pattern 105. The active pattern 105 may be divided into a central portion between two gate structures 118, and a peripheral portion (or end portions) facing the central portion with respect to each of the gate structure 118.

An ion-implantation process may be performed to form a first source/drain region 119a and a second source/drain region 119b in portions of the active pattern 105 adjacent to the gate structures 118. For example, the first source/drain region 119a may be formed in the central portion of the active pattern 105, and the second source/drain region 119b may be formed in the peripheral portions (e.g., in both end portions) of the active pattern 105.

Figure 5:
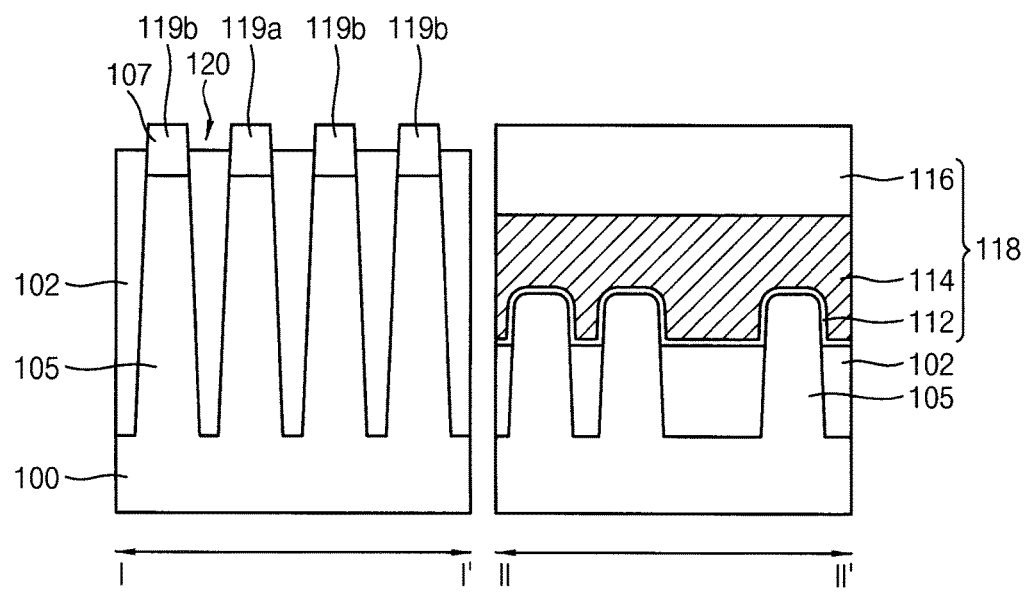
Figure 5:
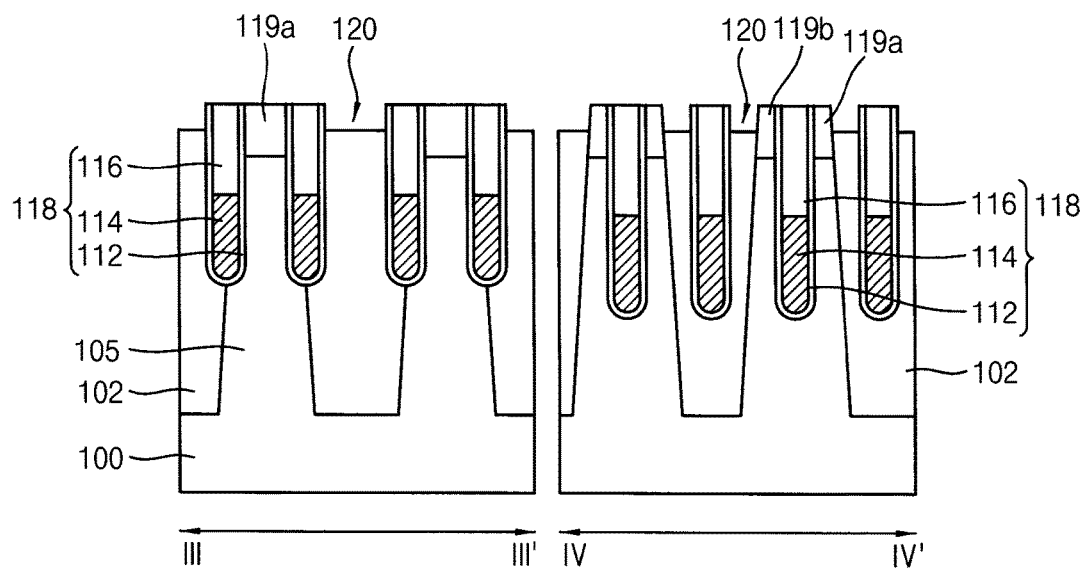

Referring to FIG. 5, the isolation layer 102 may be recessed to expose an upper portion of the active pattern 105. For example, an isolation layer 102 may be partially removed by, e.g., an etch-back process such that the upper portions of the active patterns 105 may be exposed. Accordingly, a protrusion 107 of each of the active patterns 105 exposed from the top surface of the isolation layer 102 may be formed. For example, the first and second source/drain regions 119a and 119b may be partially exposed. A recess region 120 may be defined between the protrusions 107 neighboring each other.

The gate structure 118 may be partially exposed by the recess region 120. For example, a sidewall of the gate mask pattern 116 may be exposed by the recess region 120.

Figure 6:
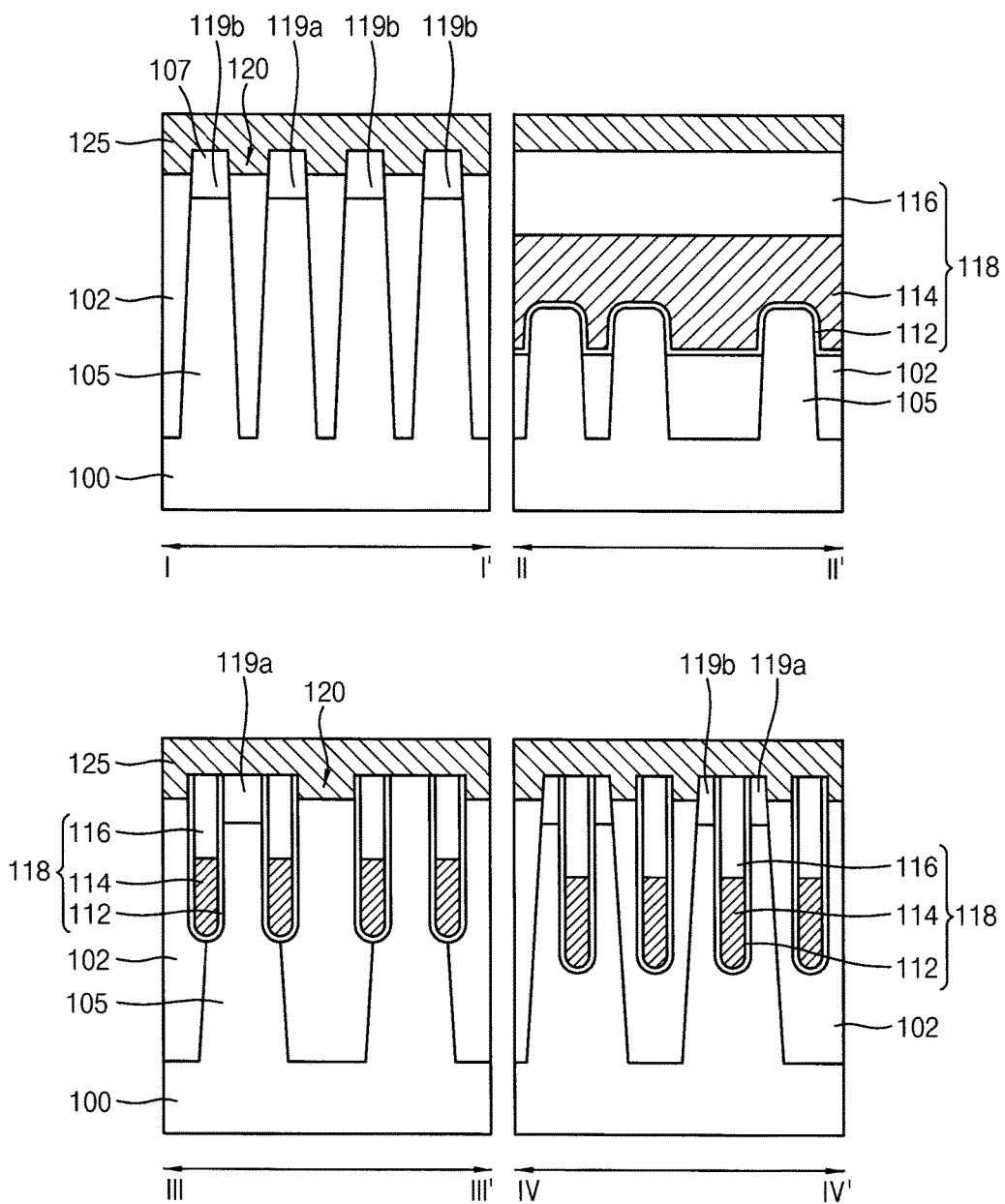

Referring to FIG. 6, a metal layer 125 may be formed on the top surface of the isolation layer 120, and surfaces of the protrusions 107 and the gate structures 118 which may be exposed by the recess region 120. The metal layer 125 may fill the recess regions 120 and cover the protrusions 107 and the gate structures 118.

In example embodiments, the metal layer 125 may be formed of a material that may have a great reactivity of a silicidation with the protrusion 107. For example, the metal layer 125 may be formed of tungsten, nickel, cobalt, titanium, molybdenum or platinum. These may be used alone or in a combination thereof. The metal layer 125 may be formed by, e.g., a sputtering process or an ALD process.

In an embodiment, carbon may be doped in the protrusions 107 before the formation of the metal layer 125. For example, an implantation process using a carbon-containing gas such as methyl silane ($SiH_3CH_3$), methane ($CH_4$) or ethane ($C_2H_6$) may be performed such that the protrusions 107 may be doped with carbon. Accordingly, the protrusion 107 may include, e.g., silicon carbide.

Figure 7:
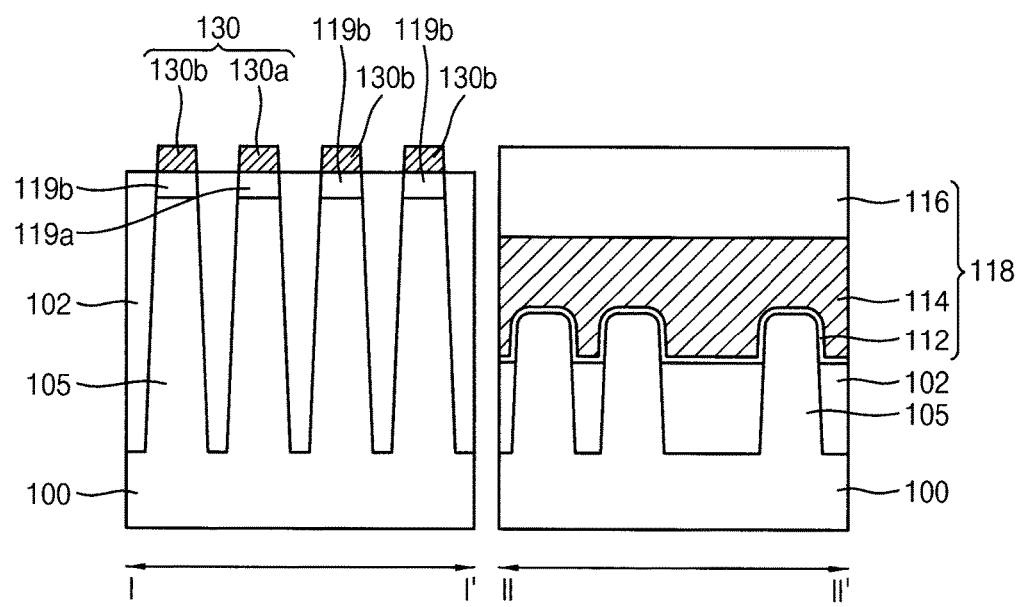
Figure 7:
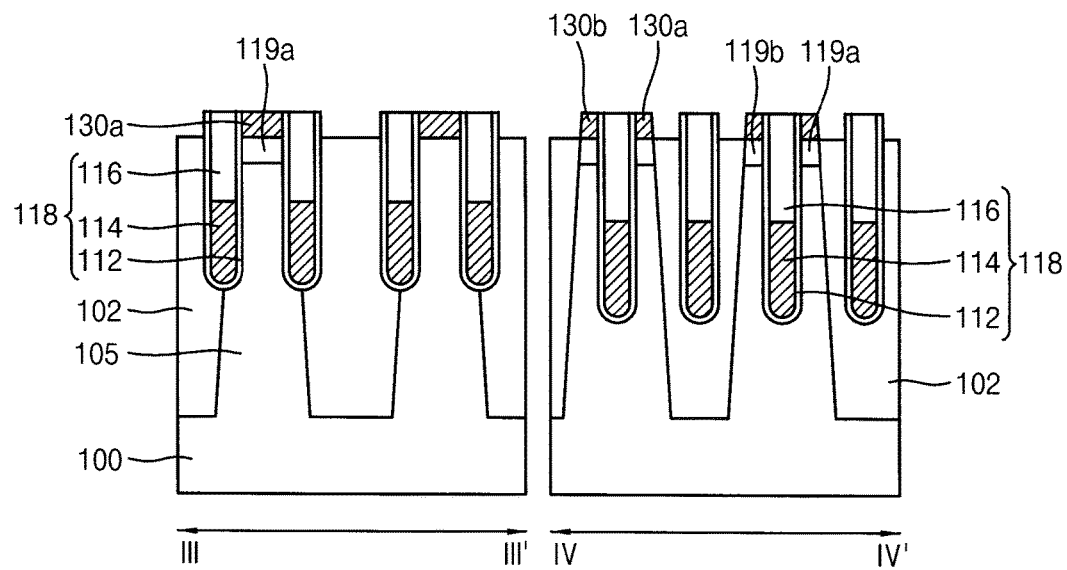

Referring to FIG. 7, the metal layer 125 and the protrusions 107 may be reacted with each other to form silicide ohmic pad 130.

In example embodiments, a thermal treatment such as an annealing process may be performed to cause the silicidation reaction between the metal layer 125 and the protrusion 107. Accordingly, an ingredient of the protrusion 107 may be converted into silicide. For example, the protrusion 107 may be converted into the silicide ohmic pad 130 including a metal silicide. In some embodiments, the silicide ohmic pad 130 may extend to a portion of the top surface of the isolation layer 102.

For example, if the metal layer 125 includes tungsten, nickel or cobalt, the silicide ohmic pad 130 may include tungsten silicide, nickel silicide or cobalt silicide, respectively.

The silicide ohmic pad 130 may be divided into a first silicide ohmic pad 130a and a second silicide ohmic pad 130b. For example, a central portion of the protrusion 107 (e.g., the protrusion 107 at the central portion of the active pattern 105 in which first source/drain region 119a is formed between the two gate structures 118) may be converted into the first silicide ohmic pad 130a. A peripheral portion of the protrusion 107 (e.g., the protrusion 107 at the peripheral portion of the active pattern 105 in which the second source/drain regions 119b are formed) may be converted into the second silicide ohmic pad 130b. An upper portion of the gate structure 118 buried in the active pattern 105 may be sandwiched between the first silicide ohmic pad 130a and the second silicide ohmic pad 130b. The first silicide ohmic pad 130a may be in contact with the first source/drain region 119a, and the second silicide ohmic pad 130b may be in contact with the second source/drain region 119b.

In example embodiments, a remaining portion of the metal layer 125 which may not be reacted with the protrusions 107 may be selectively removed. For example, the remaining portion of the metal layer 125 may be removed by a wet etching process using an etchant solution that may have an etching selectivity for a metal. The etchant solution may include, e.g., peroxide such as hydrogen peroxide, and/or an acid such as sulfuric acid or phosphoric acid. These may be used alone or in a combination thereof.

In an embodiment, if carbon is doped in the protrusion 107 as described above, the silicide ohmic pad 130 may include a carbon-doped metal silicide. For example, a carbon atom may be intervened between a silicon atom and a metal atom to mitigate or prevent an irregular diffusion or growth of the metal silicide. Therefore, an irregular expansion of the silicide ohmic pad 130 to a portion of the active pattern 105 under the protrusion 107 may be avoided.

Figure 8:
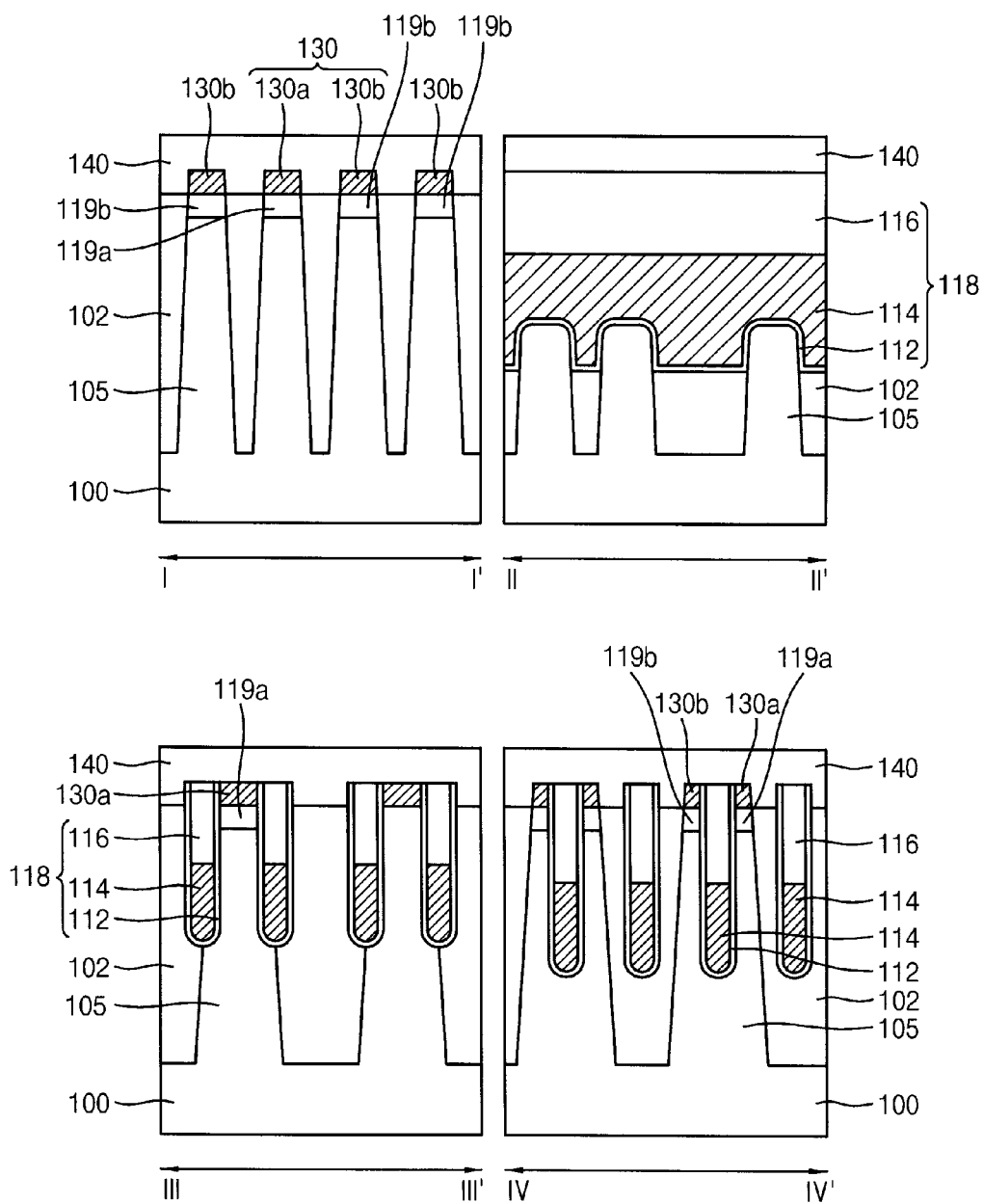

Referring to FIG. 8, a capping layer 140 covering the silicide ohmic pads 130 and the gate structures 118 may be formed on the isolation layer 102. The capping layer 140 may be formed of, e.g., silicon nitride by a CVD process.

In example embodiments, the silicide ohmic pads 130 may serve as a contact region on which an additional conductive element of the semiconductor device having the BCAT structure may be landed, or through which the conductive structure may be electrically connected to the source/drain regions 119a and 119b.

In a comparative example, for the formation of the contact region, an insulating interlayer covering an active pattern in which source/drain regions are formed may be formed, and the insulating interlayer may be partially etched to form a contact hole through which the active pattern is exposed. Doped polysilicon may be filled in the contact hole to form an ohmic pattern.

However, if the contact hole is a minute contact hole, a deposition of a highly doped polysilicon in the minute contact hole may not be easy, and a defect such as a void may be generated in the ohmic pattern. Further, as a semiconductor device becomes highly integrated, a mis-alignment of the contact hole or the ohmic pattern may be caused.

However, according to example embodiments described above, the silicide ohmic pad 130 may be formed in a self-alignment manner by forming the metal layer 125 entirely on the active pattern 105 and the isolation layer 102 and selectively reacting the metal layer 125 with the active pattern 105. Thus, the contact region having a low resistance may be formed without a mis-alignment and an etching damage of other structures. Additionally, the silicide ohmic pad 130 may include a metal silicide, and thus may have an electrical resistance lower than that of the ohmic pattern including doped polysilicon of the comparable example.

Figure 9:
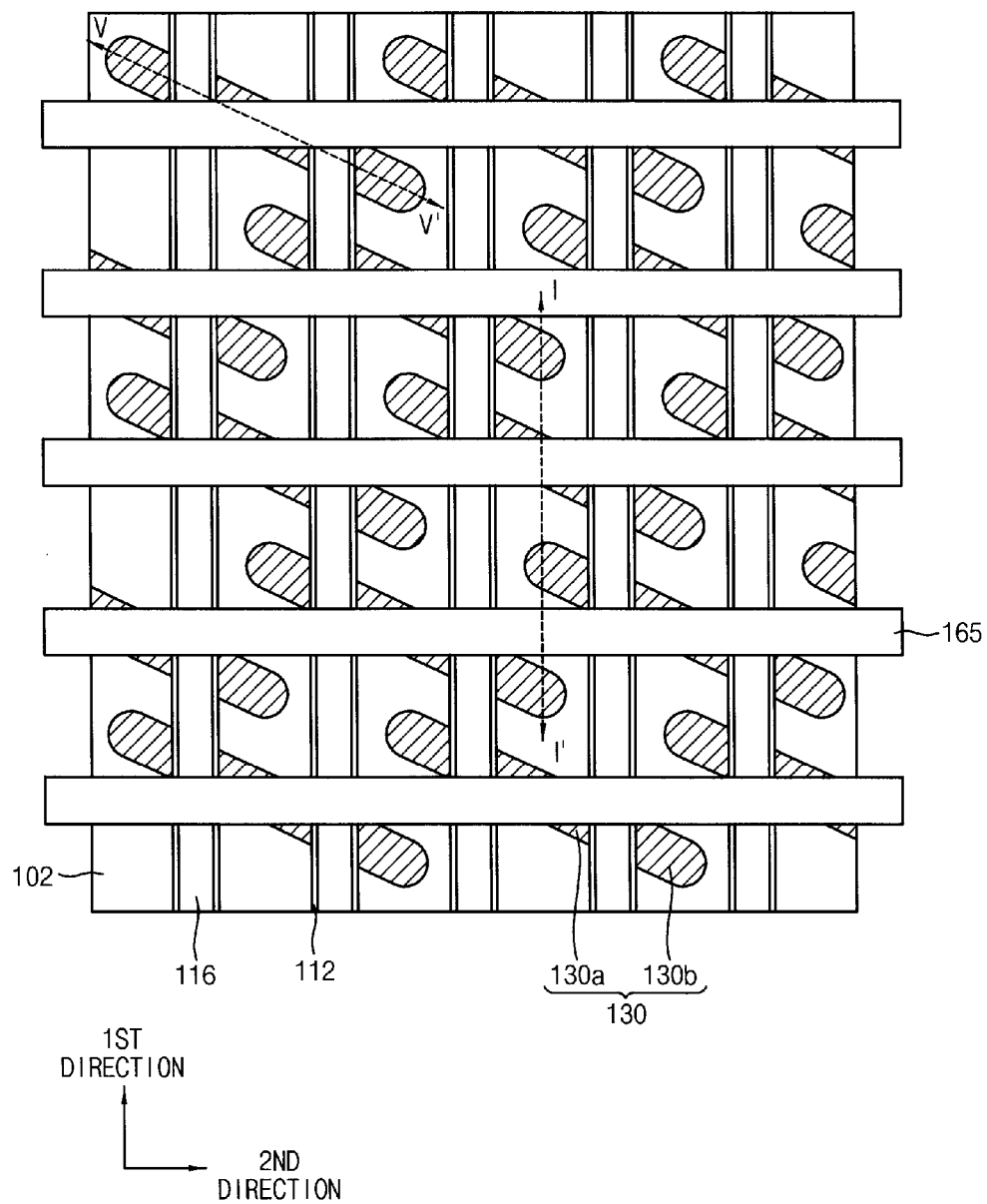
Figure 10:
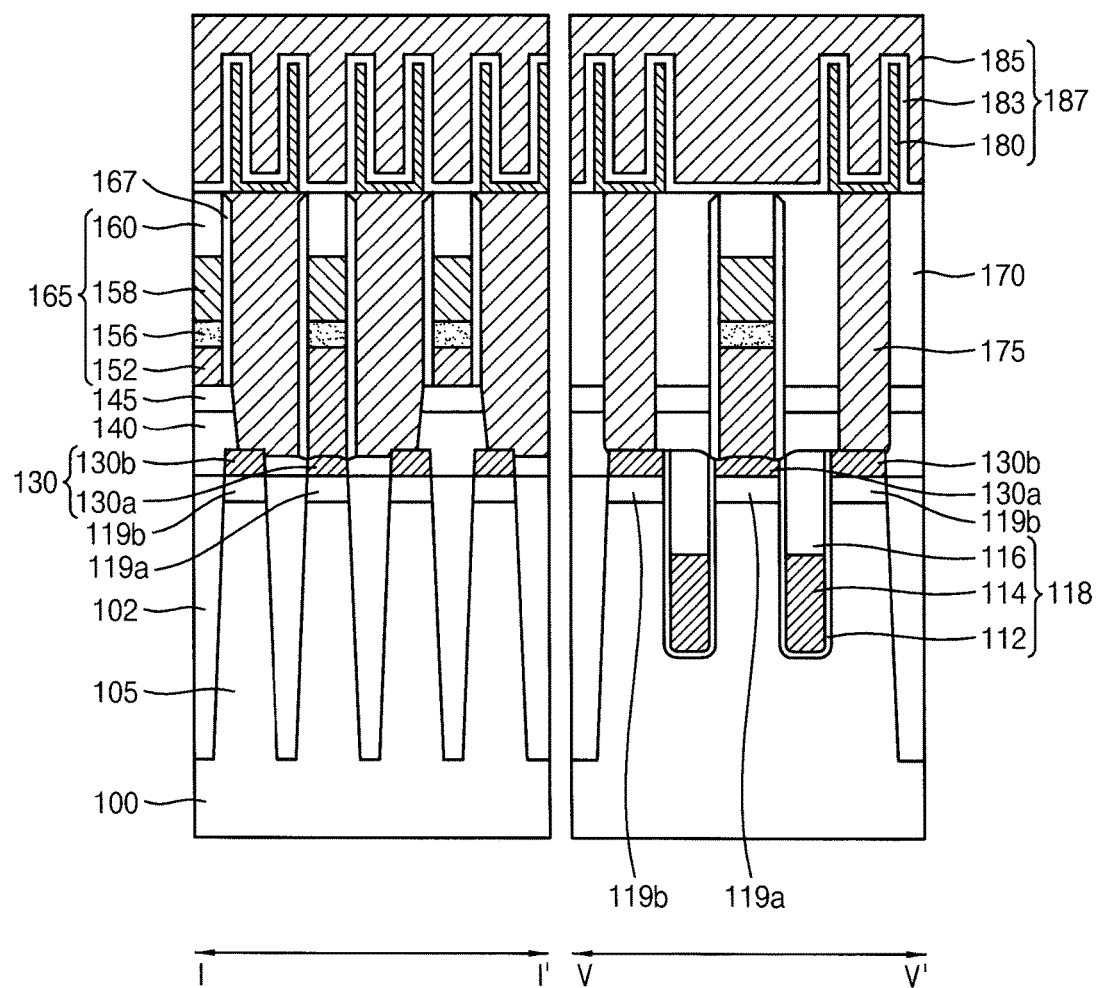
Figure 11:
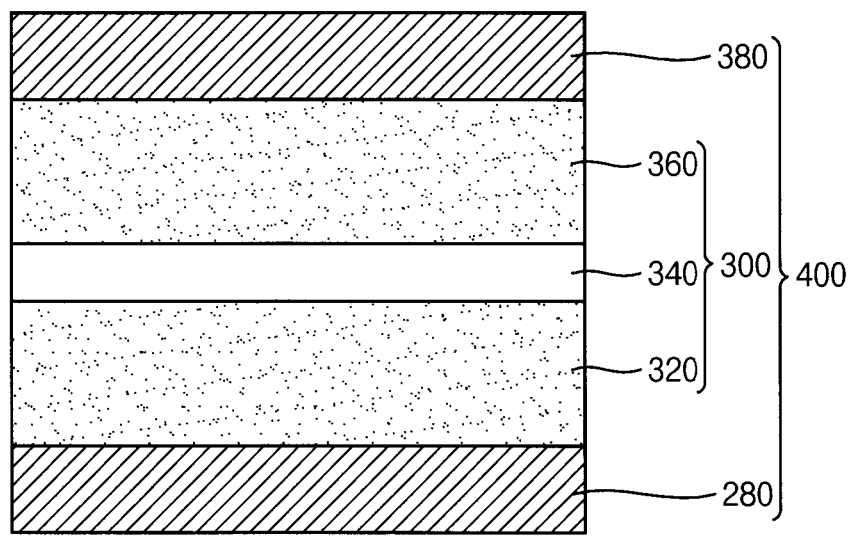

FIGS. 9 and 10 are a top plan view and a cross-sectional view, respectively, illustrating a semiconductor device in accordance with example embodiments. FIG. 11 is a cross-sectional view illustrating a data storage unit of a semiconductor device in accordance with some example embodiments.

FIG. 10 includes sub-cross sectional views taken along lines I-I' and V-V' indicated in FIG. 9. For convenience of descriptions, an isolation layer 102, silicide ohmic pads 130a and 130b, a gate mask pattern 116, and a conductive line structure 165 are illustrated, and an illustration of other elements is omitted in FIG. 9.

For example, the semiconductor device illustrated in FIGS. 9 and 10 is a memory device including the BCAT structure of FIGS. 1 and 2. Thus, detailed descriptions on repeated elements and/or structures are omitted.

Referring to FIGS. 9 and 10, the semiconductor device may include the conductive line structure 165 and a conductive contact 175 electrically connected to a first silicide ohmic pad 130a and a second silicide ohmic pad 130b, respectively, that may be formed on an upper portion of the active pattern 105. Thus, two conductive contacts 175 may be disposed on both end portions of one active pattern 105, and the conductive line structure 165 between the conductive contacts 175 may be disposed on a central portion of the active pattern 105. A data storage unit 187 may be disposed on each of the conductive contacts 175.

The conductive line structure 165 may extend in the second direction, and may be electrically connected to a plurality of the first silicide ohmic pads 130a. In example embodiments, the conductive line structure 165 may directly contact the first silicide ohmic pads 130a without any intervening connecting contact. The conductive line structure 165 may serve as a bit line of, e.g., a DRAM device. In some embodiments, the conductive line structure 165 may serve as a common source line (CSL).

The conductive line structure 165 may include a first conductive layer pattern 152, a barrier conductive layer pattern 156 and a second conductive layer pattern 158 sequentially stacked from the first silicide ohmic pad 130a.

In example embodiments, the first conductive layer pattern 152 may include doped polysilicon. The barrier conductive layer pattern 156 may include a metal nitride or a metal silicide nitride. For example, the barrier conductive layer pattern 156 may include titanium nitride (TiN), titanium silicide nitride (TiSiN), tantalum nitride (TaN) or tantalum silicide nitride (TaSiN). The second conductive layer pattern 158 may include a metal such as tungsten or copper. In some embodiments, the first conductive layer pattern 152 may be omitted in the conductive line structure 165.

In some embodiments, the conductive line structure 165 may further include a mask pattern 160 on the second conductive layer pattern 158. The mask pattern 160 may include, e.g., silicon nitride.

A spacer 167 may be formed on a sidewall of the conductive line structure 165. The conductive line structure 165 and the conductive contact 175 neighboring each other may be insulated by the spacer 167.

In example embodiments, an upper portion of the first silicide ohmic pad 130a may be partially removed such that a top surface of the first silicide ohmic pad 130a may be lower than that of the second silicide ohmic pad 130b. Accordingly, a height difference may be generated between the first and second silicide ohmic pads 130a and 130b, and thus a bridge or a short circuit may be suppressed between the conductive line structure 165 and the conductive contact 175.

The conductive contact 175 may extend through a capping layer 140, a first insulating interlayer 145 and a second insulating interlayer 170 to be in contact with the second silicide ohmic pad 130b. The conductive contact 175 may include a metal such as tungsten or copper.

In some embodiments, a barrier conductive layer including a metal nitride, e.g., titanium nitride may be further formed to surround a bottom and a sidewall of the conductive contact 175.

The data storage unit 187 including a lower electrode 180, a dielectric layer 183 and an upper electrode 185 may be disposed on each of the conductive contacts 175. In this case, the data storage unit 187 may serve as a capacitor of the DRAM device.

The data storage unit 187 may be a cylindrical capacitor. In this case, the lower electrode 180 may have a cup shape. In an embodiment, the data storage unit 187 may be a stacked-type capacitor. In this case, the lower electrode 180 may have a pillar shape.

In some embodiments, a magnetic tunnel junction (MTJ) structure 400 of a magnetic random access memory (MRAM) device illustrated in FIG. 11 may be provided as the data storage unit 187 on the conductive contact 175.

Referring to FIG. 11, the MTJ structure 400 may include a lower electrode 280, an upper electrode 380 and an MTJ 300. The MTJ 300 may be interposed between the lower electrode 280 and the upper electrode 380, and may include a fixed layer 320, a free layer 360, and a tunnel barrier 340 between the fixed layer 320 and the free layer 360. The lower electrode 280 may be electrically connected to the conductive contact 175 of FIG. 10.

The fixed layer 320 of the MTJ 300 may be configured to have a fixed magnetization direction. The free layer 360 of the MTJ 300 may have a parallel or anti-parallel magnetization direction with respect to that of the fixed layer 320. The fixed layer 320 and the free layer 360 may include a magnetic material. The tunnel barrier 340 may include magnesium oxide, titanium oxide, aluminum oxide, magnesium zinc oxide and/or magnesium boron oxide. The lower electrode 280 and the upper electrode 380 may include a conductive metal nitride, e.g., titanium nitride, tantalum nitride and/or tungsten nitride.

FIGS. 12 to 19 are cross-sectional views illustrating a method of manufacturing a semiconductor device in accordance with example embodiments. FIGS. 12 to 19 include sub-cross sectional views taken along lines I-I' and V-V' indicated in FIG. 9. For example, FIGS. 12 to 19 illustrate a method of manufacturing the semiconductor device of FIGS. 9 to 11.

Detailed descriptions on processes substantially the same as or similar to those illustrated with reference to FIGS. 3 to 8 are omitted.

Figure 12:
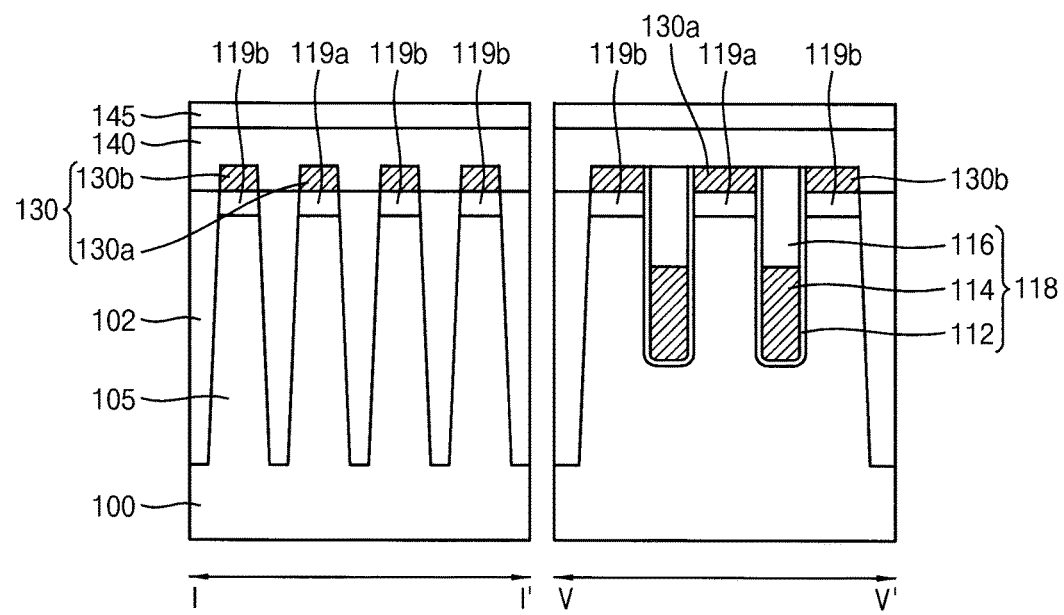

Referring to FIG. 12, processes substantially the same as or similar to those illustrated with reference to FIGS. 3 to 8 may be performed.

Accordingly, active patterns 105 defined and separated by an isolation layer 102 may be formed. A gate structure 118 including a gate insulation layer 112, a gate electrode 114 and a gate mask pattern 116 may be formed to be buried or embedded in the active pattern 105. The gate structure 118 may extend in the first direction as illustrated in FIG. 9. The gate electrode 114 may serve as a word line of the semiconductor device. The active pattern 105 may be divided into a central portion between two gate structures 118, and a peripheral portion (or end portions) facing the central portion with respect to each of the gate structure 118.

The isolation layer 102 may be partially removed to form a protrusion (e.g., 107 of FIG. 5) of the active pattern 105 exposed from a top surface of the isolation layer 102. A metal layer (e.g., 125 of FIG. 6) may be formed on the protrusion 107, and the protrusion 107 and the metal layer 125 may be reacted with each other to create silicide. For example, a central portion of the protrusion 107 (e.g., the protrusion 107 at the central portion of the active pattern 105) may be converted into a first silicide ohmic pad 130a, and a peripheral portion of the protrusion 107 (e.g., the protrusion 107 at the peripheral portion of the active pattern 105) may be converted into a second silicide ohmic pad 130b. In some embodiments, the first and second silicide ohmic pads 130a and 130b may extend to a portion of the top surface of the isolation layer 102. A capping layer 140 covering the first and second silicide ohmic pads 130a and 130b may be formed.

A first insulating interlayer 145 may be formed on the capping layer. The first insulating interlayer 145 may be formed of, e.g., silicon oxide by a CVD process.

Figure 13:
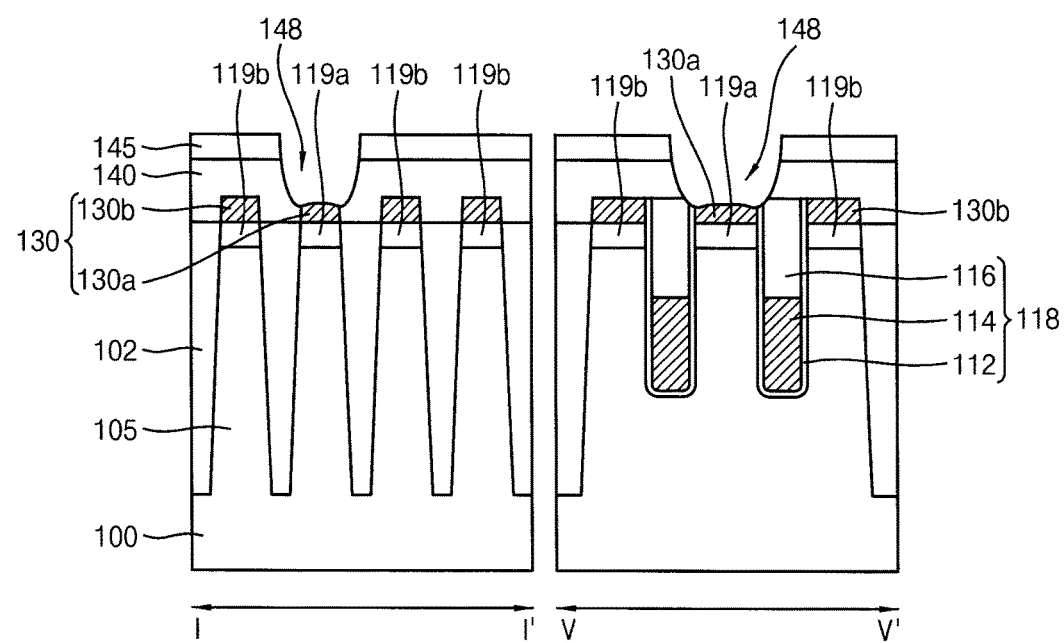

Referring to FIG. 13, the first insulating interlayer 145 and the capping layer 140 may be partially etched to form a groove 148 through which the first silicide ohmic pad 130a may be exposed.

The groove 148 may extend in the second direction indicated in FIG. 9, and a plurality of the grooves 148 may be formed to be arranged along the first direction.

In example embodiments, a photoresist pattern may be formed on the first insulating interlayer 145, and the first insulating interlayer 145 may be partially etched using the photoresist pattern as an etching mask. Then, the capping layer 140 also may be partially etched to form the groove 148 through which the first silicide ohmic pads 130a may be exposed. The capping layer 140 may substantially serve as an etch-stop layer.

In some embodiments, the first silicide ohmic pad 130a may be also partially removed by the etching process. Accordingly, a height difference between the first and second silicide ohmic pads 130a and 130b may be generated, and thus a bridge or a short circuit between a conductive line structure 165 and a conductive contact 175 formed by subsequent processes may be mitigated or prevented.

Figure 14:
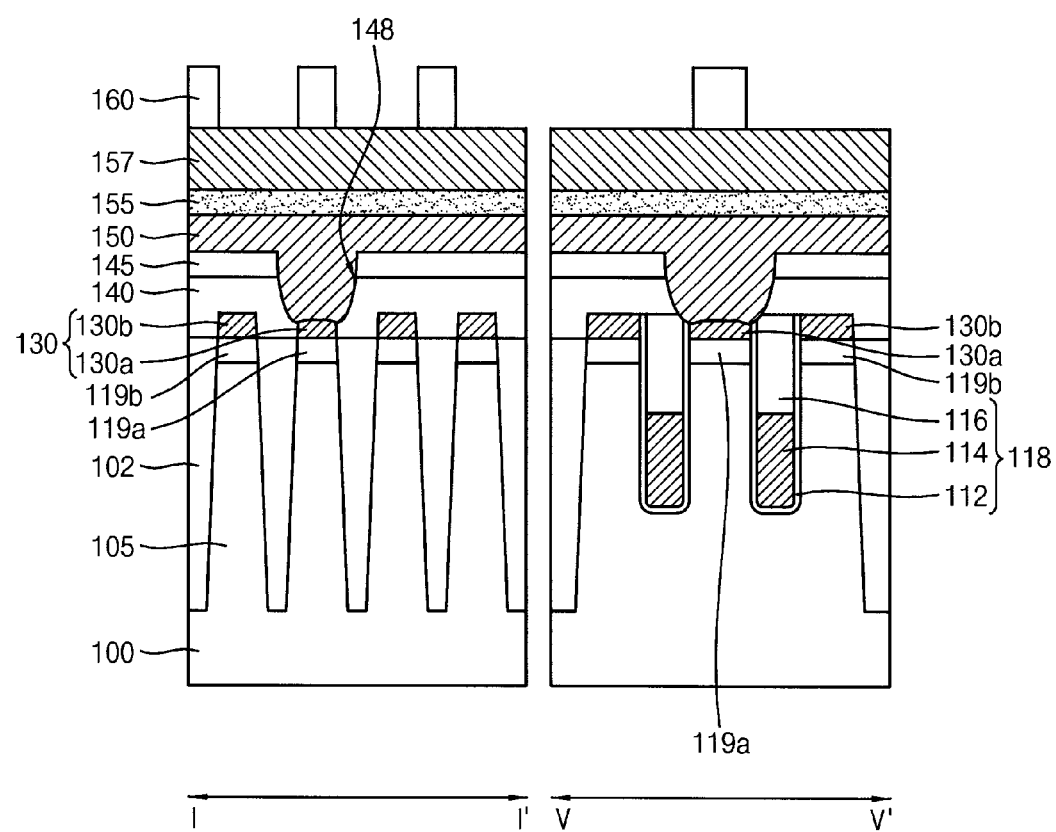

Referring to FIG. 14, a first conductive layer filling the groove 148 may be formed on the first insulating interlayer 145. A barrier conductive layer 155 and a second conductive layer 157 may be sequentially formed on the first conductive layer 150, and a mask pattern 160 may be formed on the second conductive layer 157.

For example, the first conductive layer 150 may be formed using doped polysilicon, the barrier conductive layer 155 may be formed of a metal nitride or a metal silicide, and the second conductive layer 157 may be formed using a metal. The first conductive layer 150, the barrier conductive layer 155 and the second conductive layer 157 may be formed by, e.g., a sputtering process, a PVD process, CVD process, or an ALD process.

The mask pattern 160 may include, e.g., silicon nitride, and may extend in the second direction. A width of the mask pattern 160 may be smaller than that of the groove 148. The mask pattern 160 may have a width in the first direction smaller than that of the first silicide ohmic pad 130*a*.

Figure 15:
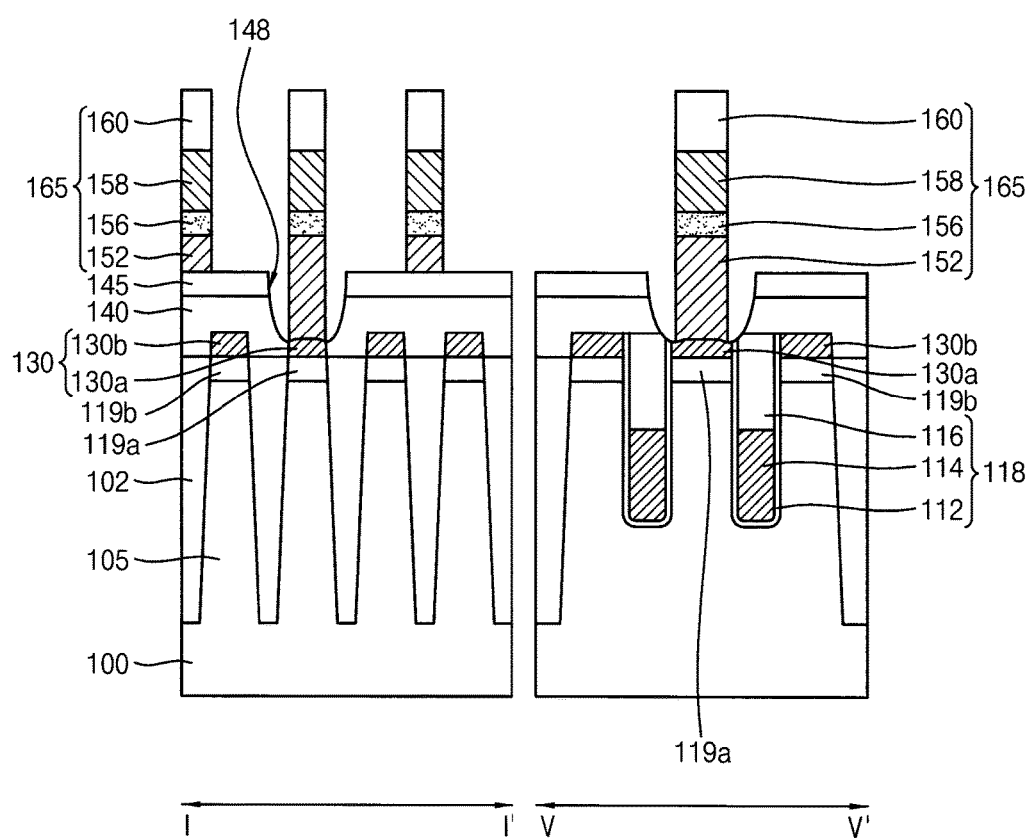

Referring to FIG. 15, the second conductive layer 157, the barrier conductive layer 155 and the first conductive layer 150 may be sequentially etched using the mask pattern 160 as an etching mask. Accordingly, a first conductive layer pattern 152, a barrier conductive layer pattern 156 and a second conductive layer pattern 158 may be sequentially formed on the first silicide ohmic pad 130*a*.

Accordingly, the conductive line structure 165 may be formed on the first silicide ohmic pad 130*a* to be in contact with the first silicide ohmic pad 130*a*, and may extend in the second direction. The conductive line structure 165 may include the first conductive layer pattern 152, the barrier conductive layer pattern 156 and the second conductive layer pattern 158 and the mask pattern 160. In some embodiments, the conductive line structure 165 may include the barrier conductive layer pattern 156 and the second conductive layer pattern 158 without the first conductive layer pattern 152. The conductive line structure 165 may serve as a bit line. In some embodiments, the conductive line structure 165 may serve as a common source line (CSL).

In some embodiments, the conductive line structure 165 may have a narrower width that that of the groove 148. Thus, a sidewall of the conductive line structure 165 may be spaced apart form a sidewall of the groove 148. The conductive line structure 165 may have a width in the first direction smaller than that of the first silicide ohmic pad 130*a*.

Figure 16:
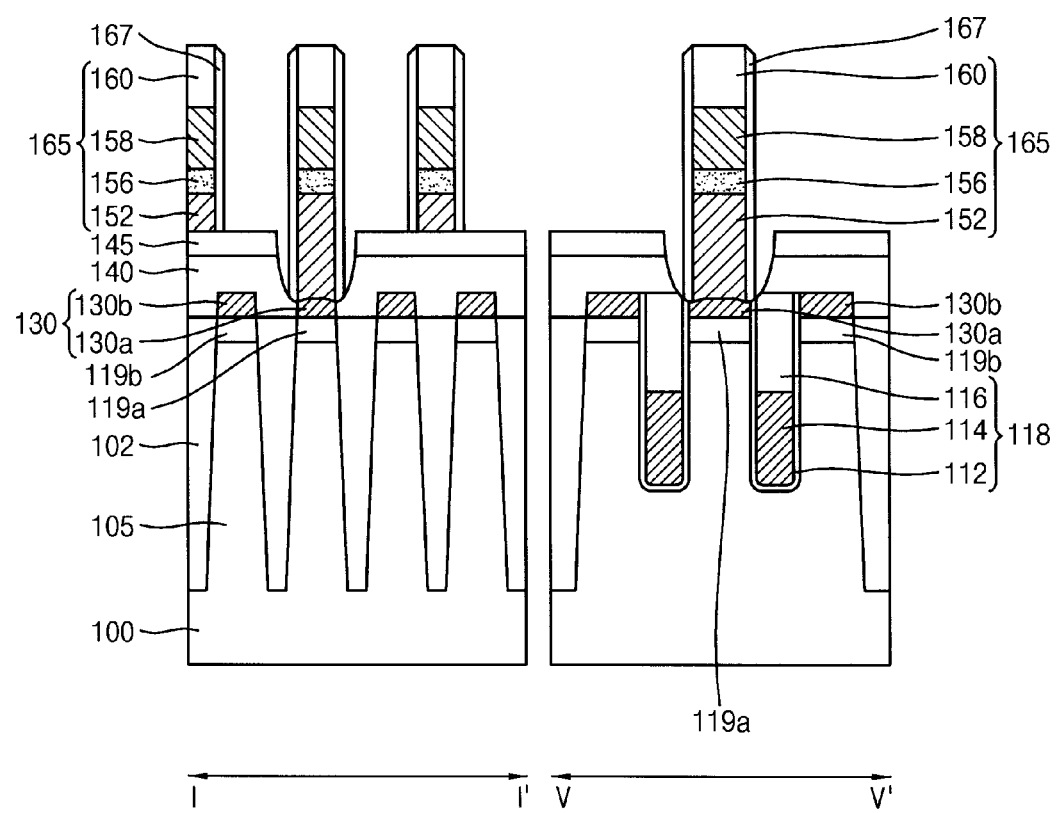

Referring to FIG. 16, a spacer 167 may be formed on the sidewall of the conductive line structure 165.

For example, a spacer layer covering the conductive line structure 165 may be formed on the first insulating interlayer 145. The spacer layer may be anisotropically etched to form the spacer 167. The spacer layer may be formed of, e.g., silicon nitride.

Figure 17:
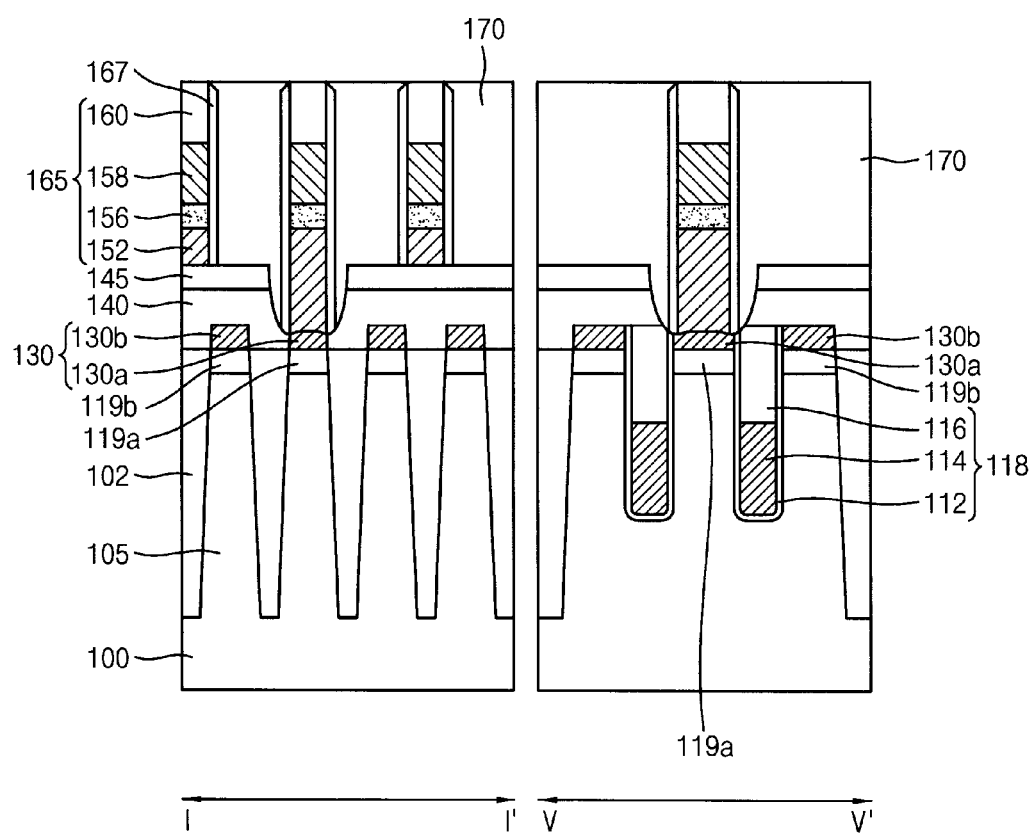

Referring to FIG. 17, a second insulating interlayer 170 covering the conductive line structure 165 may be formed on the first insulating interlayer 145. An upper portion of the second insulating interlayer 170 may be planarized by a CMP process until a top surface of the mask pattern 160 is exposed.

The second insulating interlayer 170 may be formed of silicon oxide by a CVD process or an ALD process.

Figure 18:
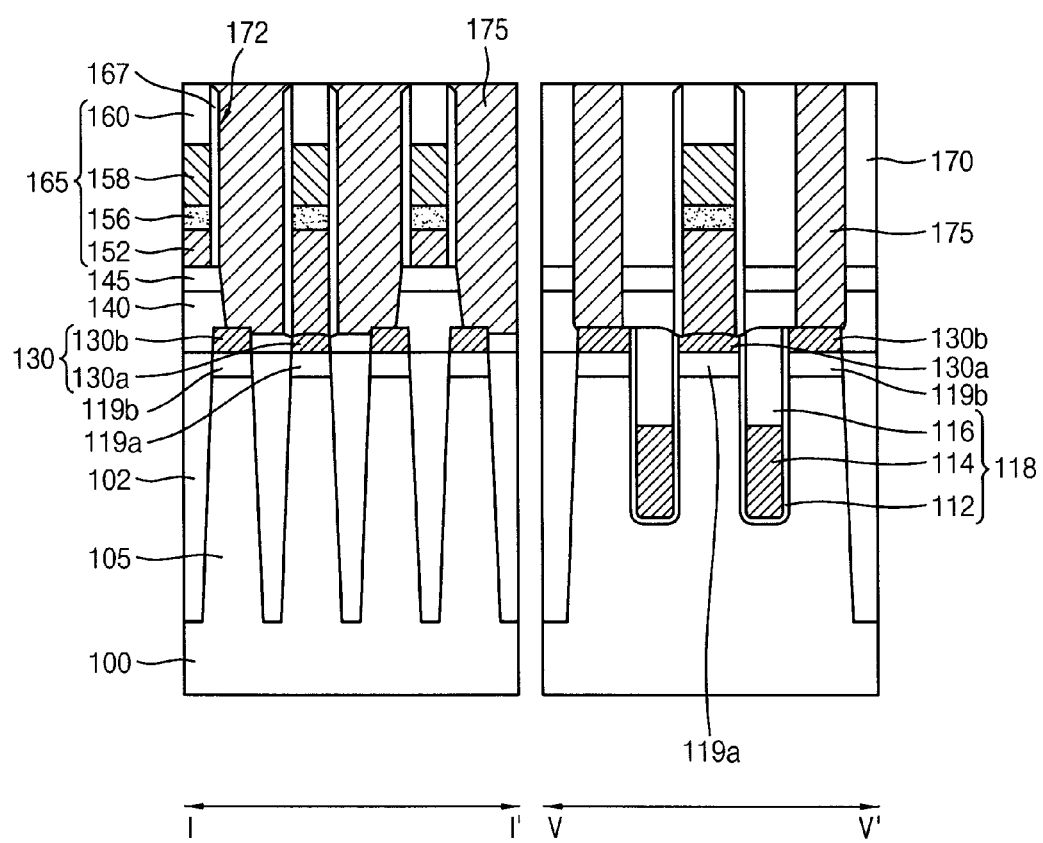

Referring to FIG. 18, the second insulating interlayer 170, the first insulating interlayer 145 and the capping layer 140 may be partially etched to form a contact hole 172 through which the second silicide ohmic pad 130*b* may be exposed.

In example embodiments, each contact hole 172 may be formed to expose each second silicide ohmic pad 130*b*. Accordingly, two contact holes 172 may be formed on each of the active patterns 150. A sidewall of the spacer 167 may be also exposed by the contact hole 172.

In some embodiments, a top surface of the second silicide ohmic pad 130*b* may be partially exposed through the contact hole 172. Thus, an isolated distance between the conductive contact 175 and the conductive line structure 165 may be increased, and a parasitic capacitance may be reduced.

A contact conductive layer filling the contact holes 172 may be formed, and an upper portion of the contact conductive layer may be planarized by a CMP process until the top surface of the mask pattern 160 is exposed. Accordingly, the conductive contact 175 may be formed in each contact hole 172, and may be in contact with the second silicide ohmic pad 130*b*.

The contact conductive layer may be formed using a metal such as copper or tungsten by a sputtering process, a PVD process, an ALD process, or a CVD process.

In some embodiments, the contact conductive layer may be formed by a plating process. For example, a copper seed layer may be formed on an innerwall of the contact hole 172, and an electroplating process may be performed using the seed layer to grow the contact conductive layer filling the contact hole 172. In other embodiment, the contact conductive layer may be formed by an electroless plating process, e.g., a chemical plating process.

In some embodiments, a barrier conductive layer including, e.g., titanium or titanium nitride may be formed on the innerwall of the contact hole 172 before forming the contact conductive layer.

Figure 19:
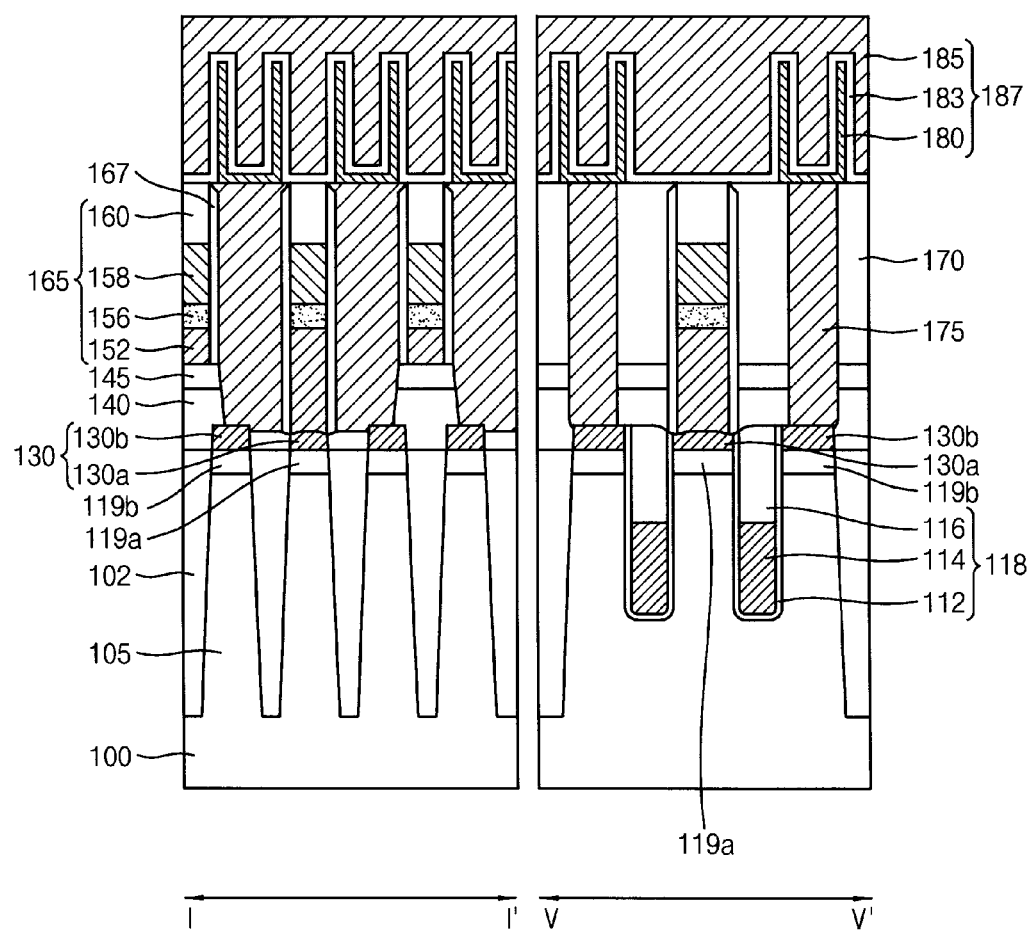

Referring to FIG. 19, a data storage unit 187 electrically connected to the conductive contact 175 may be formed. In example embodiments, the data storage unit 187 may serve as a capacitor of a DRAM device. In this case, the data storage unit 187 may include a cylindrical lower electrode 180 electrically connected to the conductive contact 175, a dielectric layer 183 covering the lower electrode 180, and an upper electrode 185 on the dielectric layer 183.

For example, an etch-stop layer and a mold layer (not illustrated) may be formed on the mask pattern 160, the second insulating interlayer 170 and the conductive contact 175. The mold layer and the etch-stop layer may be partially removed to form an opening through which a top surface of the conductive contact 175 is exposed.

A lower electrode layer may be formed along the innerwall of the opening and a top surface of the mold layer. The lower electrode layer may be formed of a metal or a metal nitride. For example, the lower electrode layer may be formed of at least one of tungsten, tungsten nitride, titanium, titanium nitride, tantalum, tantalum nitride and/or ruthenium. A sacrificial layer (not illustrated) may be formed on the lower electrode layer, and upper portions of the sacrificial layer and the lower electrode layer may be planarized such that the top surface of the mold layer is exposed. The sacrificial layer and the mold layer may be removed to form the lower electrode 180.

The dielectric layer 183 may be formed on surfaces of the etch-stop layer and the lower electrode 180, and the upper electrode 185 may be formed on the dielectric layer 183 to form the data storage unit 187. The dielectric layer 183 may be formed of silicon oxide or a metal oxide having a high dielectric constant. The upper electrode 185 may be formed of a metal or a metal nitride.

In some embodiments, the MTJ structure 400 of an MRAM device as illustrated in FIG. 11 may be formed on the conductive contact 175 instead of the capacitor of the DRAM device. For example, a lower electrode 280 may be formed to be electrically connected to the conductive contact 175, and a fixed layer 320, a tunnel barrier 340 and a free layer 360 may be sequentially formed on the lower electrode 280 to form an MTJ 300. An upper electrode 380 may be formed on the MTJ 300 to be connected to the free layer 360. The fixed layer 320 and the free layer 360 may be formed of a magnetic material. The tunnel barrier 340 may be formed of at least one of magnesium oxide, titanium oxide, aluminum oxide, magnesium zinc oxide and magnesium boron oxide. The lower electrode 280 and the upper electrode 380 may be formed of a conductive metal nitride, e.g., titanium nitride, tantalum nitride and/or tungsten nitride.

Figure 20:
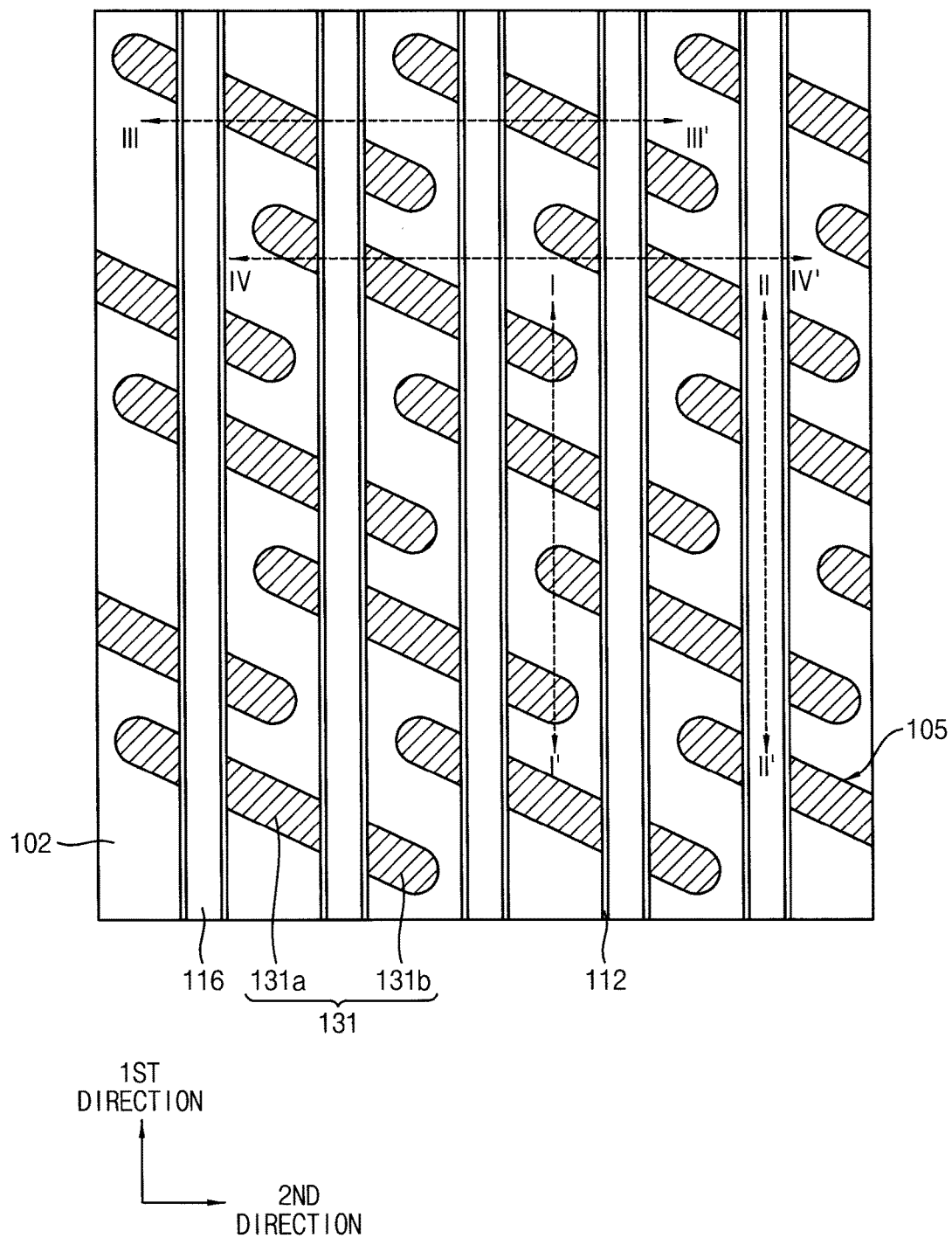
Figure 21:
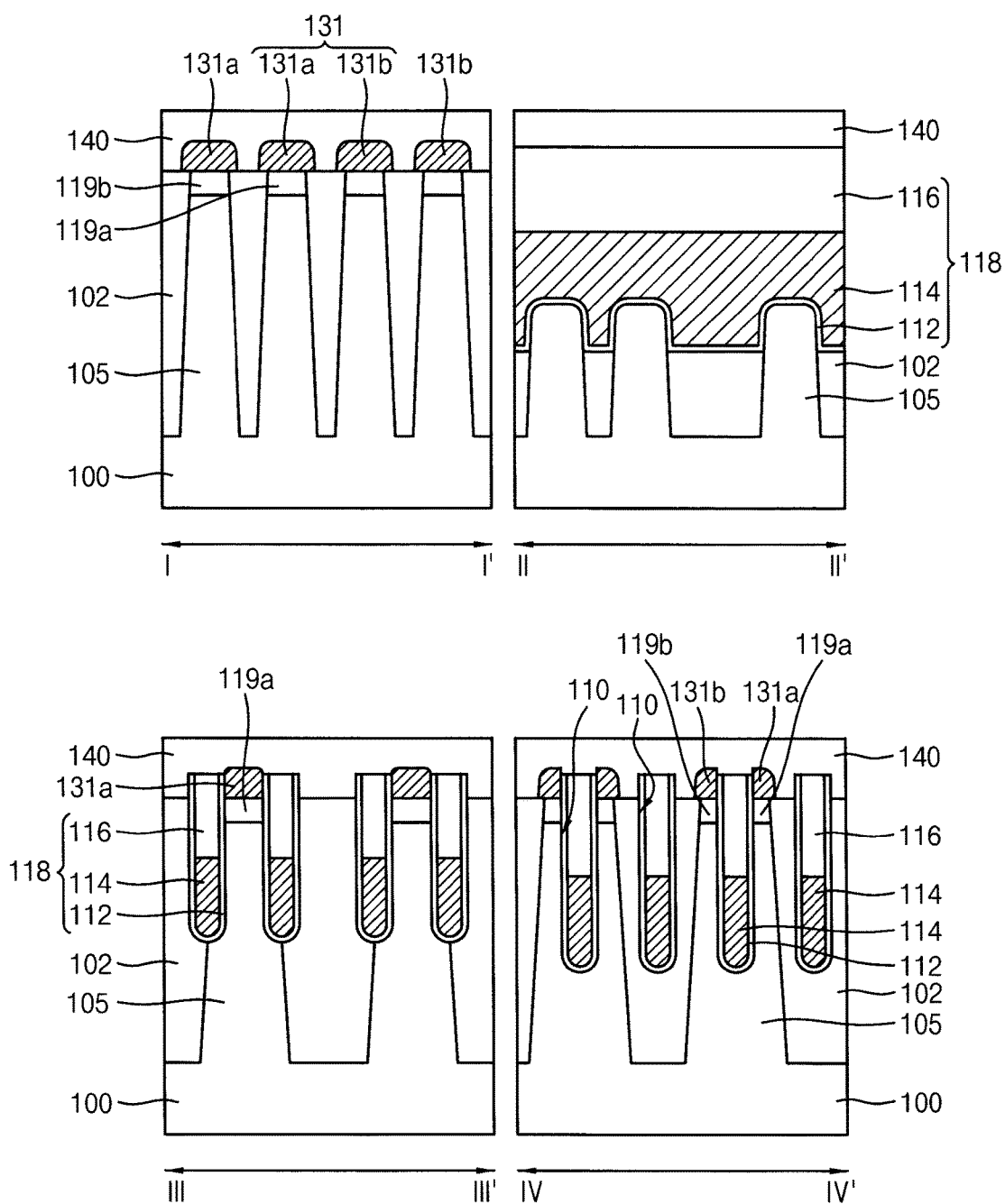

FIGS. 20 and 21 are a top plan view and a cross-sectional view, respectively, illustrating a semiconductor device in accordance with example embodiments. For example, FIGS. 20 and 21 illustrate a semiconductor device having a BCAT structure in accordance with example embodiments.

FIG. 21 includes sub-cross sectional views taken along lines I-I', II-II', III-III' and IV-IV' indicated in FIG. 20.

The semiconductor devices of FIGS. 20 and 21 may have elements and/or constructions substantially the same as or similar to those of FIGS. 1 and 2 except for a shape of silicide ohmic pads. Thus, detailed descriptions on repeated elements and/or structures are omitted.

Referring to FIGS. 20 and 21, the semiconductor device may include a substrate 100, active patterns 105 and gate structures 118 extending through upper portions of the active patterns 105.

The active pattern 105 may have an island shape defined by an isolation layer 102.

The gate structure 118 may include a gate insulation layer 112, a gate electrode 114 and a gate mask pattern 116 sequentially stacked from a bottom of a gate trench 110.

A silicide ohmic pad 131 partially overlapping a top surface of the isolation layer 102 may be formed at an upper portion of the active pattern 105. The silicide ohmic pad 131 may include a metal silicide or a carbon-doped metal silicide. The silicide ohmic pad 131 may include a first silicide ohmic pad 131a and a second silicide ohmic pad 131b. The first silicide ohmic pad 131a may be formed at a central portion of the active pattern 105, and the second silicide ohmic pad 131b may be formed at a peripheral portion (or both end portions) of the active pattern 105

In example embodiments, the silicide ohmic pad 131 may cover a top surface of the active pattern 105 and may also extend to the top surface of the isolation layer 102. For example, as illustrated in FIG. 21, the silicide ohmic pad 131 may have a width greater than that of a portion of the active pattern 105 adjacent thereto. In an embodiment, a bottom of silicide ohmic pad 131 may have a cross-sectional dimension greater than that of the top surface of the active pattern 105 that is in contact with the silicide ohmic pad 131. The bottom of the silicide ohmic pad 131 may be also in contact with the top surface of the isolation layer.

In some embodiments, the silicide ohmic pad 131 may protrude from a top surface of the gate structure 118. For example, a top surface of the each silicide ohmic pad 131 may be at a level higher than that of a top surface of the gate mask pattern 116.

In some embodiments, structures illustrated with reference to FIGS. 9 to 11 may be further disposed on the silicide ohmic pad 131. For example, a conductive line structure 165 may be in contact with or electrically connected to the first silicide ohmic pad 131a and may extend in the second direction. A conductive contact 175 may be in contact with or electrically connected to the second silicide ohmic pad 131b. A data storage unit 187 such as a capacitor or an MTJ structure 400 including an MTJ 300 may be disposed on the conductive contact 175.

According to example embodiments illustrated in FIGS. 20 and 21, a dimension, an area or a width of the silicide ohmic pad 131 may be increased when compared to that of the silicide ohmic pad 130 illustrated in FIGS. 1 and 2. Thus, a tolerance of an alignment of the conductive line structure 165 and the conductive contact 175 with the first silicide ohmic pad 131a and the second silicide ohmic pad 131b, respectively, may be increased. Additionally, a contact resistance between the conductive line structure 165 (or the conductive contact 175) and the silicide ohmic pad 131a and 131b may be reduced.

FIGS. 22 to 25 are cross-sectional views illustrating a method of manufacturing a semiconductor device in accordance with example embodiments. FIGS. 22 to 25 include sub-cross sectional views taken along lines I-I', II-II', III-III' and IV-IV' indicated in FIG. 20. For example, FIGS. 22 to 25 illustrate a method of manufacturing the semiconductor device of FIGS. 20 and 21.

Detailed descriptions on processes substantially the same as or similar to those illustrated with reference to FIGS. 3 to 8 are omitted.

Figure 22:
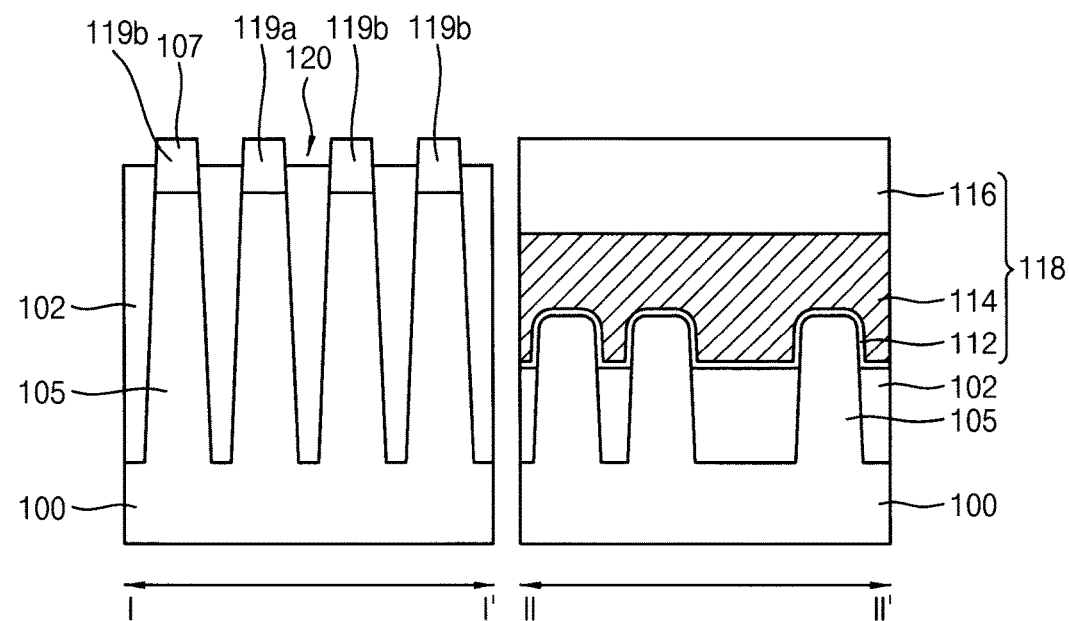
Figure 22:
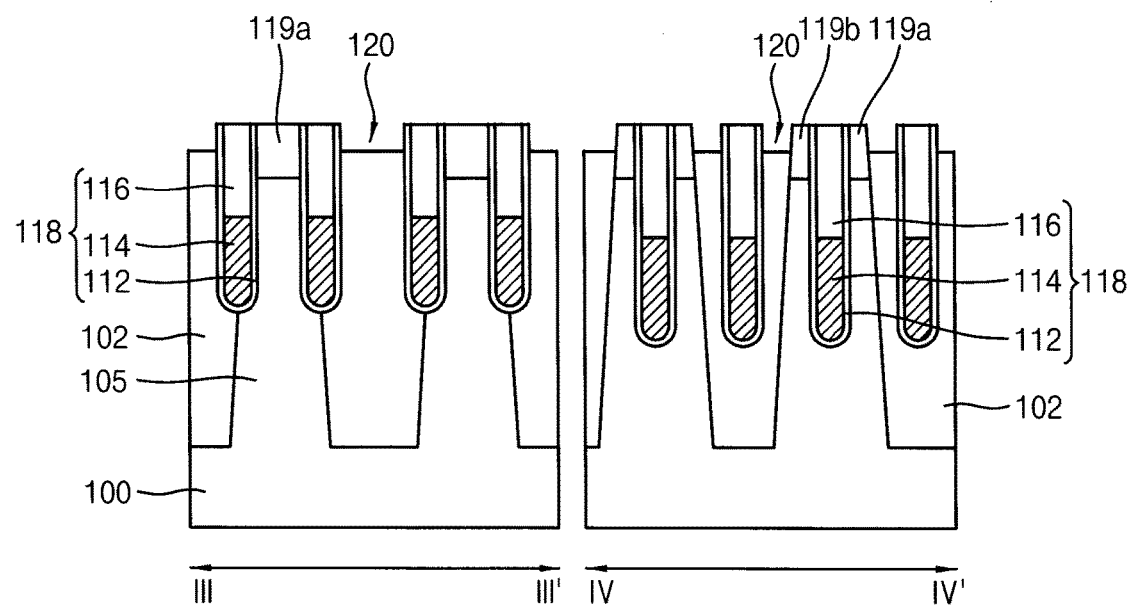

Referring to FIG. 22, processes substantially the same as or similar to those illustrated with reference to FIGS. 3 to 5 may be performed.

Accordingly, an isolation layer 102 and active patterns 105 may be formed, gate structures 118 being buried and extending in the active patterns 105 may be formed, and first and second source/drain regions 119a and 119b may be formed. The active pattern 105 may be divided into a central portion between two gate structures 118, and a peripheral portion (or end portions) facing the central portion with respect to each of the gate structure 118.

The isolation layer 102 may be recessed to expose upper portions of the active patterns 105. Thus, a protrusion 107 exposed from a top surface of the isolation layer 102 may be defined from each of the active patterns 105. A recess region 120 may be defined between the protrusions neighboring each other.

Figure 23:
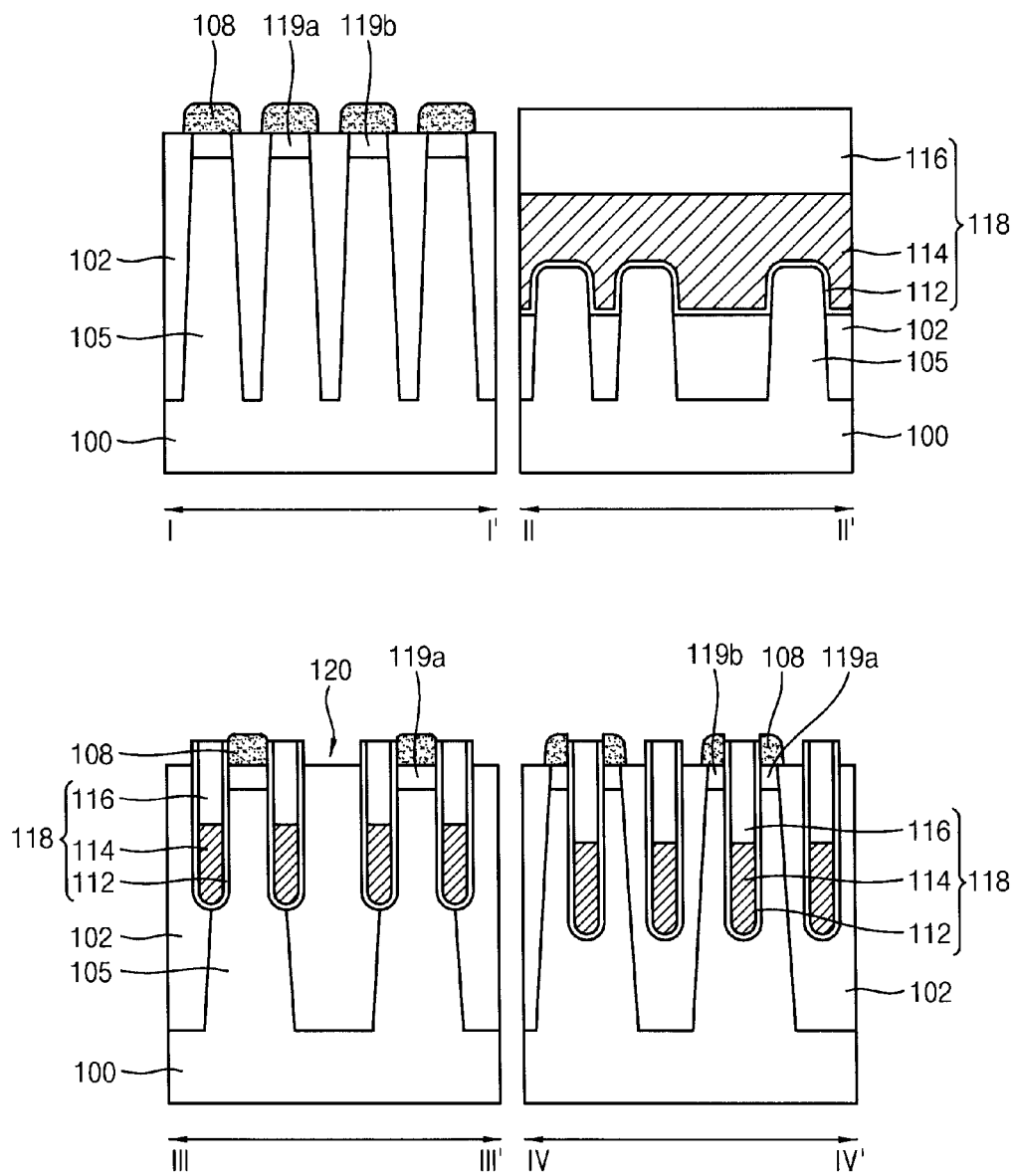

Referring to FIG. 23, the protrusion 107 may be grown to form an expanded protrusion 108.

In example embodiments, the expanded protrusion 108 may be formed by a selective epitaxial growth (SEG) process using the protrusion 107 as a seed. Thus, the expanded protrusion 108 may have increased width and/or height from those of the protrusion 107. In some embodiments, a bottom of the expanded protrusion 108 may be in contact with the top surface of the isolation layer. A top surface of the expanded protrusion 108 may be higher than that of the gate mask pattern 116.

In some embodiments, while performing the SEG process, a carbon-containing gas may be provided on the protrusion 107. The carbon-containing gas may include, e.g., methyl silane, methane or ethane. These may be used alone or in a combination thereof. In this case, the expanded protrusion 108 may include a carbon-doped silicon based material such as silicon carbide. An irregular growth of the expanded protrusion may be mitigated or prevented by the carbon doping.

Figure 24:
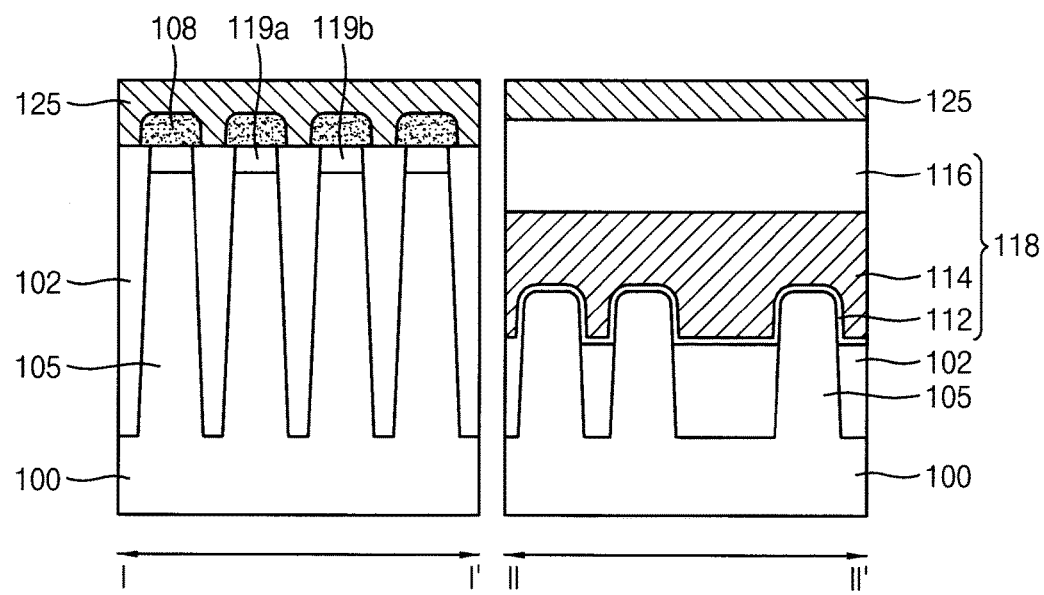
Figure 24:
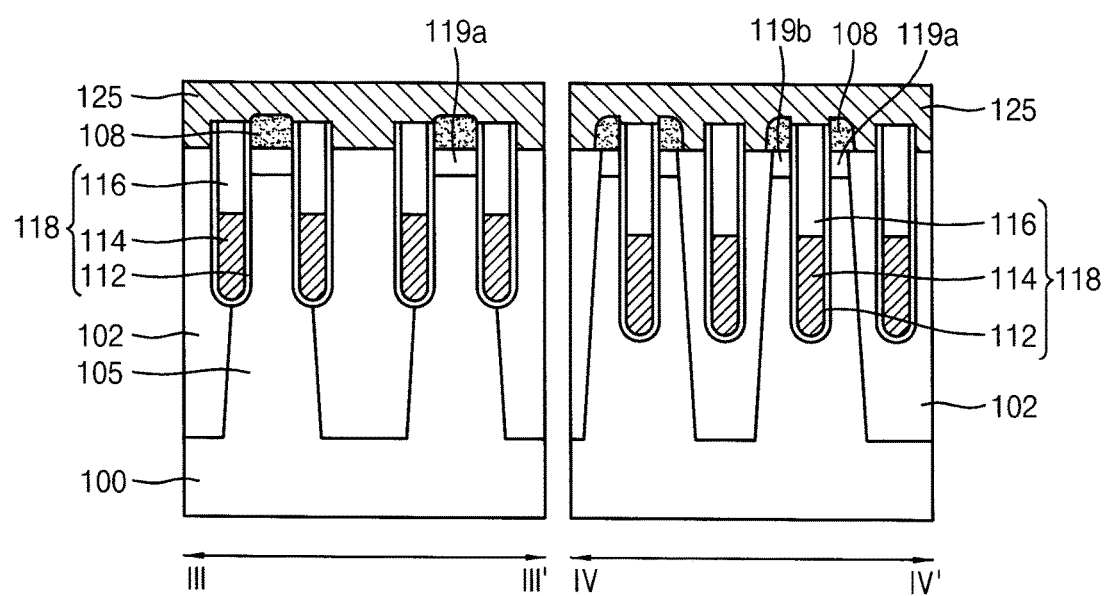

Referring to FIG. 24, a process substantially the same as or similar to that illustrated with reference to FIG. 6 may be performed. Accordingly, a metal layer 125 covering the expanded protrusion 108 and the gate structures 118 may be formed on the isolation layer 102.

Figure 25:
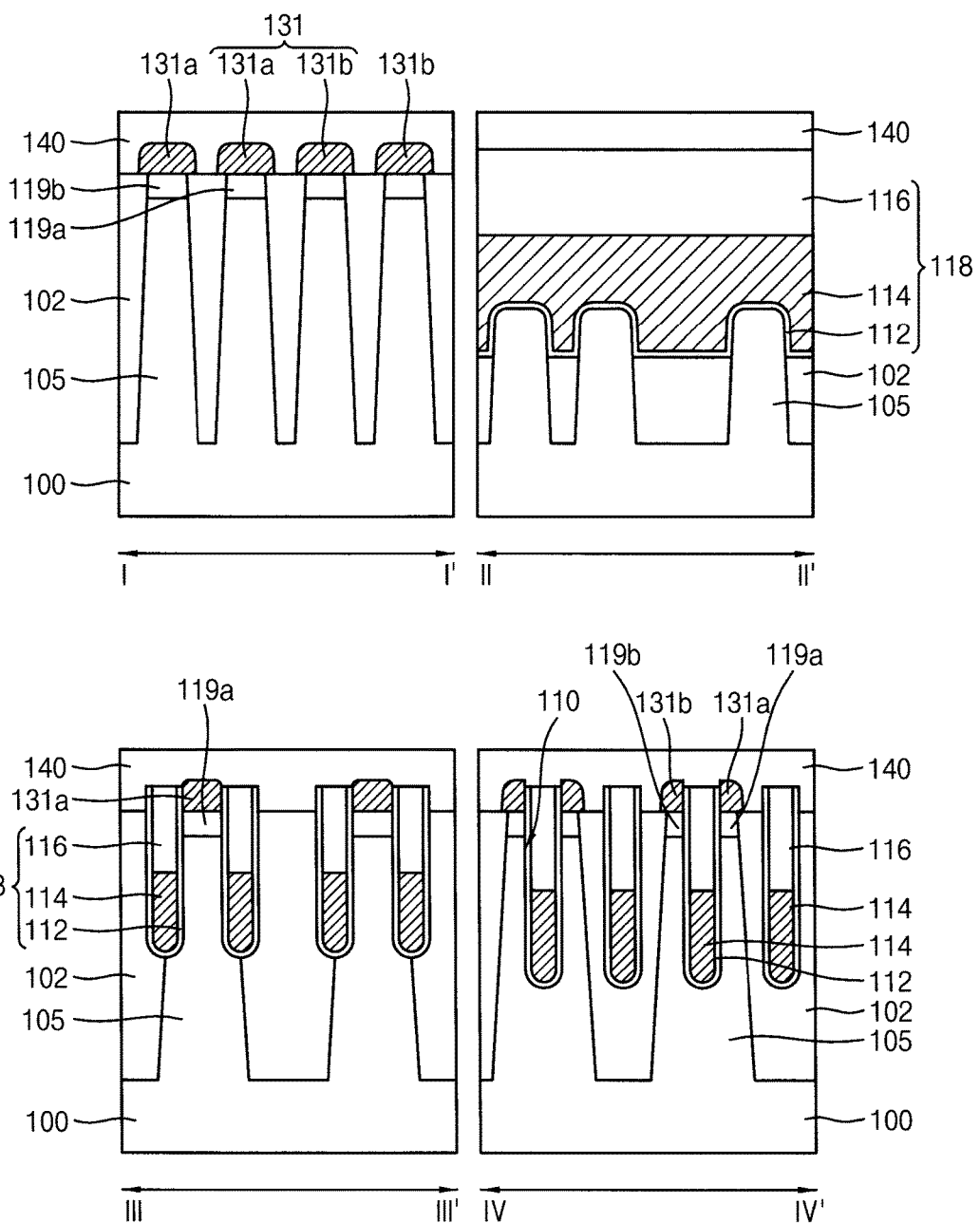

Referring to FIG. 25, processes substantially the same as or similar to those illustrated with reference to FIGS. 7 and 8 may be performed.

Accordingly, the metal layer 125 and the expanded protrusion 108 may be reacted with each other such that the expanded protrusion 108 may be transformed into silicide ohmic pad 131. The silicide ohmic pad 131 may include a first silicide ohmic pad 131*a* and a second silicide ohmic pad 131*b*. For example, a central portion of the expanded protrusion 108 (e.g., the expanded protrusion 108 at the central portion of the active pattern 105 in which the first source/drain region 119*a* may be formed between the two gate structures 118) may be transformed into the first ohmic pad 131*a*. A peripheral portion of the expanded protrusion 108 (e.g., the expanded protrusion 108 at the peripheral portion of the active pattern 105 in which the second source/drain regions 119*b* may be formed) may be transformed into the second silicide ohmic pad 131*b*.

An upper portion of the gate structure 118 may be sandwiched between the first and second silicide ohmic pads 131*a* and 131*b*. The first silicide ohmic pad 131*a* may be in contact with the first source/drain region 119*a*, and the second silicide ohmic pad 131*b* may be in contact with the second source/drain region 119*b*.

A remaining portion of the metal layer 125 that may not be reacted with the expanded protrusion 108 may be selectively removed by, e.g., a wet etching process using a peroxide solution and/or an acid solution.

After the formation of the silicide ohmic pad 131, a capping layer 140 covering the silicide ohmic pads 131 and the gate structures 118 may be formed on the isolation layer 102.

In some embodiments, processes substantially the same as or similar to those illustrated with reference to FIGS. 12 to 19 may be additionally performed. Accordingly, a conductive line structure 165 and a conductive contact 175 may be formed to be electrically connected to or to be in contact with the first silicide ohmic pad 131*a* and the second silicide ohmic pad 131*b*, respectively. Since the first and second silicide ohmic pads 131*a* and 131*b* may have expanded dimensions, a mis-alignment of each of the conductive line structure 165 and the conductive contact 175 with a corresponding one of the first and second silicide ohmic pads 131*a* and 131*b* may be reduced.

A data storage unit 187 may be formed on the conductive contact 175. The data storage unit 187 may include a capacitor or an MTJ structure 400. Accordingly, a DRAM device or an MRAM device having a BCAT structure may be obtained.

According to example embodiments of the inventive concepts, a gate structure may be formed in an active pattern, and an isolation layer may be partially removed to expose an upper portion of the active pattern. A metal layer covering the active pattern and the gate structure may be formed, and the metal layer and the upper portion of the active pattern may be reacted with each other by a thermal treatment such that an ohmic pad including a metal silicide of a low resistance may be formed.

The ohmic pad may be formed in a self-alignment manner by forming the metal layer entirely on the active pattern, the isolation layer and the gate structure, and selectively reacting the metal layer with the active pattern. Thus, a low resistance pattern for reducing a contact resistance may be formed without a mis-alignment and an etching damage of other structures.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:

forming a plurality of active patterns in a substrate, the active patterns being spaced apart from each other by an isolation layer;

forming gate structures, each of which extends in the isolation layer through the active patterns, each of the active patterns being divided by the gate structures into a central portion and a peripheral portion facing the central portion;

forming a protrusion from each of the active patterns, the protrusion being exposed from a top surface of the isolation layer;

transforming each of the protrusions into silicide such that a first silicide ohmic pad is formed at the central portion of each of the active patterns, and a second silicide ohmic pad is formed at the peripheral portion of each of the active patterns;

forming a conductive line structure electrically connected to the first silicide ohmic pad;

forming a conductive contact electrically connected to the second silicide ohmic pad; and forming a data storage unit electrically connected to the conductive contact.

2. The method of claim 1, wherein the first and second silicide ohmic pads include a metal silicide or a carbon-doped metal silicide.

3. The method of claim 1, further comprising:

forming a first source/drain region and a second source/drain region in each of the active patterns; and wherein the first source/drain region is formed in the central portion of each of the active patterns, and the second source/drain region is formed in the peripheral portion of each of the active patterns, and the first silicide ohmic pad is in contact with the first source/drain region, and the second silicide ohmic pad is in contact with the second source/drain region.

4. The method of claim 1, wherein the transforming includes:

partially recessing the isolation layer to form the protrusion of each of the active patterns;

forming a metal layer on each of the protrusions; and reacting each of the protrusions with the metal layer such that each of the protrusions is transformed into a metal silicide.

5. The method of claim 1, wherein the forming gate structures includes:

forming trenches spaced apart from each other, the trenches extending through the active patterns and the isolation layer;

forming a gate insulation layer on an inner wall of each of the trenches; and forming a gate electrode and a gate mask pattern on the gate insulation layer to fill each of the trenches,
wherein two of the gate structures extend through each of the active patterns.

6. The method of claim 1, wherein the gate line structure and the conductive line structure extend in a first direction and a second direction, respectively, which cross each other, and
the active pattern extends in a diagonal direction with respect to the first direction or the second direction by an angle.

7. The method of claim 1, wherein the first silicide ohmic pad and the second silicide ohmic pad extend to a top surface of the isolation layer to have a width greater than a width of the active pattern.

8. The method of claim 1, wherein a bottom of each of the first and second silicide ohmic pads is in contact with a top surface of the isolation layer.

9. The method of claim 1, further comprising:
forming a capping layer covering the first and second silicide ohmic pads;
partially removing the capping layer to form a groove through which at least one of the first silicide ohmic pads is exposed; and
forming the conductive line structure in the groove.

10. The method of claim 9, further comprising:
forming an insulating interlayer covering the conductive line structure;
partially removing the insulating interlayer to form a contact hole through which at least one of the second silicide ohmic pad is exposed; and
forming the conductive contact electrically connected to the second silicide ohmic pad in the contact hole.

11. The method of claim 1, wherein the data storage unit includes a capacitor or a magnetic tunnel junction (MTJ) structure.

12. A method of manufacturing a semiconductor device, comprising:
forming a plurality of active patterns in a substrate, the active patterns being spaced apart from each other by an isolation layer;
forming gate structures, each of which extends in the isolation layer through the active patterns;
recessing the isolation layer such that upper portions of the active patterns are exposed;
forming a metal layer covering the active patterns on the isolation layer; and
reacting the metal layer with the upper portions of the active patterns such that the upper portions of the active patterns are transformed into silicide ohmic pads.

13. The method of claim 12, wherein the forming gate structures includes:
forming trenches in the active patterns and the isolation layer;
forming a gate insulation layer on an inner wall of each of the trenches; and
forming a gate electrode and a gate mask pattern on the gate insulation layer to fill each of the trenches.

14. The method of claim 13, further comprising:
doping carbon in the upper portions of the active patterns.

15. The method of claim 14, wherein the silicide ohmic pads include a carbon-doped metal silicide.

16. The method of claim 12, before forming the metal layer, further comprising:
selectively and epitaxially growing the upper portions of the active patterns such that a dimension of the upper portions is expanded.

17. The method of claim 16, wherein the upper portions of the active patterns extend to a top surface of the isolation layer.

18. A method of manufacturing a semiconductor device, comprising:
forming an isolation layer in the substrate, the isolation layer defining a plurality of active patterns spaced apart from each other;
forming gate structures, each of which extends through the active patterns and the isolation layer in a diagonal direction with respect to an extension direction of each of the active patterns;
partially removing the isolation layer such that recess regions are defined by a top surface of the isolation layer and upper sidewalls of the active patterns;
forming a metal layer filling the recess regions and covering the active patterns; and
transforming portions of the active patterns in contact with the metal layer into metal silicide ohmic pads.

19. The method of claim 18, before forming the metal layer, further comprising:
forming impurity regions in upper portions of the active patterns which define the recess regions.

20. The method of claim 18, wherein the transforming includes:
thermally treating the metal layer to cause a silicidation of a portion of the metal layer which is in contact with the active patterns; and
removing a portion of the metal layer remaining in the recess regions and on the active patterns.

* * * * *